US012813148B2

(12) United States Patent
Kim et al.

(10) Patent No.: US 12,813,148 B2
(45) Date of Patent: Nov. 24, 2026

(54) PROTECTION FILM AND DISPLAY DEVICE INCLUDING THE SAME

(71) Applicant: Samsung Display Co., LTD., Yongin-si (KR)

(72) Inventors: Myunghwan Kim, Yongin-si (KR); Sangyeol Kim, Yongin-si (KR); Sinae Park, Yongin-si (KR); Sejoong Shin, Yongin-si (KR); Ho Ryun Chung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 283 days.

(21) Appl. No.: 18/385,418

(22) Filed: Oct. 31, 2023

(65) Prior Publication Data

US 2024/0244940 A1 Jul. 18, 2024

(30) Foreign Application Priority Data

Jan. 18, 2023 (KR) ........................ 10-2023-0007351

(51) Int. Cl.
*H10K 59/80* (2023.01)
*H10K 59/40* (2023.01)

(52) U.S. Cl.
CPC ......... *H10K 59/8792* (2023.02); *H10K 59/40* (2023.02); *H10K 59/873* (2023.02)

(58) Field of Classification Search
None
See application file for complete search history.

(56) References Cited

U.S. PATENT DOCUMENTS 10,347,700 B2 7/2019 Yang et al.
10,971,702 B2 4/2021 Kim et al.
11,004,918 B2 * 5/2021 Kim ........................ C07C 39/06
11,154,902 B2 10/2021 Toba et al.
(Continued)

FOREIGN PATENT DOCUMENTS

JP 6695727 B2 4/2020
KR 101595034 B1 2/2016
(Continued)

OTHER PUBLICATIONS

CA-310 카탈로그 및 매뉴얼 (visko.co.kr) (https://visko.co.kr/product/CA-310-Series-catalog) (Instruction Manual).
(Continued)

*Primary Examiner* — Long Pham
(74) *Attorney, Agent, or Firm* — CANTOR COLBURN LLP

(57) ABSTRACT

A display device includes a display panel, a sensor layer disposed on the display panel, an anti-reflection layer disposed on the sensor layer, where the anti-reflection layer includes a colorant, and a protection member disposed on the anti-reflection layer, where the display panel includes a base substrate, a light emitting element disposed on the base substrate, and an encapsulation layer disposed on the light emitting element, where the protection member includes a base layer, and a protection layer disposed on at least one selected from an upper surface and a lower surface of the base layer, where the protection layer includes a hard coating agent and an ultraviolet light absorber.

20 Claims, 13 Drawing Sheets

(56) References Cited

U.S. PATENT DOCUMENTS

| | | | | |
|---|---|---|---|---|
| 2017/0294621 | A1 | 10/2017 | Higano et al. | |
| 2017/0317316 | A1 | 11/2017 | Yang et al. | |
| 2019/0280064 | A1* | 9/2019 | Kim | C07C 39/06 |

FOREIGN PATENT DOCUMENTS

| | | | |
|---|---|---|---|
| KR | 20170113822 | A | 10/2017 |
| KR | 20170124438 | A | 11/2017 |
| KR | 102056658 | B1 | 12/2019 |
| KR | 1020210083559 | A | 7/2021 |
| KR | 102302953 | B1 | 9/2021 |
| KR | 20210126804 | A | 10/2021 |
| KR | 102367247 | B1 | 2/2022 |
| KR | 102544243 | B1 | 6/2023 |

OTHER PUBLICATIONS

CA-310 카탈로그 및 메뉴얼 (visko.co.kr) (https://visko.co.kr/product/CA-310-Series-catalog).

* cited by examiner

PROTECTION FILM AND DISPLAY DEVICE INCLUDING THE SAME

This application claims priority to Korean Patent Application No. 10-2023-0007351, filed on Jan. 18, 2023, and all the benefits accruing therefrom under 35 U.S.C. § 119, the content of which in its entirety is herein incorporated by reference.

BACKGROUND

1. Field

The disclosure herein relates to a protection film and a display device including the protection film, and more particularly, to a protection film with improved ultraviolet light and near ultraviolet light absorption properties and a display device including the protection film.

2. Description of the Related Art

Various display devices used for multimedia devices such as televisions, mobile phones, tablet computers, game consoles, and the like are being developed. A display device may include various optical functional layers to provide color images having high quality to users.

Recently, to implement various types of display devices such as display devices including curved surfaces, rollable display devices, foldable display devices, or the like, research on thin display devices has been conducted.

SUMMARY

A display device may be implemented as a thin display device by reducing the number of optical functional layers therein, or including an optical functional layer having various functions.

The disclosure provides a protection film exhibiting high mechanical properties and having reliability with respect to ultraviolet light by including a base layer, and a hard coating layer and an ultraviolet light absorber in a protection layer disposed on at least one selected from an upper surface and a lower surface of the base layer.

The disclosure also provides a display device in which quality degradation of the display device due to ultraviolet light is effectively prevented by blocking ultraviolet light.

An embodiment of the invention provides a display device including a display panel, a sensor layer disposed on the display panel, an anti-reflection layer disposed on the sensor layer, where the anti-reflection layer includes a colorant, and a protection member disposed on the anti-reflection layer, where the display panel includes a base substrate, a light emitting element disposed on the base substrate, and an encapsulation layer disposed on the light emitting element, where the protection member includes a base layer, and a protection layer disposed on at least one selected from an upper surface and a lower surface of the base layer, where the protection layer includes a hard coating agent and an ultraviolet light absorber.

In an embodiment, a light transmittance of the protection member may be about 10% or less for light in a wavelength range of about 380 nanometers (nm) to about 410 nm, and may be about 87% or greater for light in a wavelength range of about 450 nm to about 1000 nm.

In an embodiment, a light transmittance of the protection member may be about 1% or less for light in a wavelength range of about 380 nm to about 400 nm.

In an embodiment, a thickness of the protection layer may be less than the thickness of the base layer.

In an embodiment, a thickness of the protection layer may be in a range of about 1 micrometer (μm) to about 15 μm, and a thickness of the base layer may be in a range of about 20 μm to about 125 μm.

In an embodiment, the protection layer may be disposed on the upper surface of the base layer, and may be in contact with the upper surface of the base layer.

In an embodiment, the protection layer may be disposed in the lower surface of the base layer.

In an embodiment, the protection layer may include a first protection layer disposed on the upper surface of the base layer, and a second protection layer disposed on the lower surface of the base layer.

In an embodiment, the protection member may further include an adhesive layer disposed between the base layer and the anti-reflection layer.

In an embodiment, the display device may further include a window disposed on the anti-reflection layer, where the protection member may be disposed between the anti-reflection layer and the window or disposed on an upper surface of the window.

In an embodiment, the colorant included in the anti-reflection layer may have a maximum absorption wavelength in a wavelength region of about 490 nm to about 505 nm and about 585 nm to about 600 nm.

In an embodiment, a first light emitting region, from which a first light is emitted, and a second light emitting region, from which a second light having a different light emitting wavelength from the first light is emitted, may be defined on the base substrate, where the anti-reflection layer may include a first color filter overlapping the first light emitting region, and including a first first colorant, a second color filter overlapping the second light emitting region, and including a second first colorant having a different maximum absorption wavelength from the first first colorant, and an overcoating layer covering the first color filter and the second color filter, and overlapping the first light emitting region and the second light emitting region.

In an embodiment, a light emitting region and a light blocking region adjacent to the light emitting region may be defined on the base substrate, where the anti-reflection layer may further include a light blocking portion overlapping the light blocking region.

In an embodiment, the sensor layer may include a sensor base layer disposed on the encapsulation layer, a first conductive layer disposed on the sensor base layer, an inorganic insulation layer disposed on the first conductive layer, a second conductive layer disposed on the inorganic insulation layer, and an organic insulation layer disposed on the second conductive layer, where the first conductive layer and the second conductive layer may overlap the light blocking portion on a plane.

In an embodiment, the display panel may further include an inorganic deposition layer disposed on the light emitting element, where the inorganic deposition layer may include an inorganic material having a refractive index of about 1.0 or greater and a light absorption coefficient of about 0.5 or greater.

In an embodiment, the light emitting element may include a first electrode disposed on the base layer, a hole transport region disposed on the first electrode, a light emitting layer disposed on the hole transport region, an electron transport region disposed on the light emitting layer, a second electrode disposed on the electron transport region, and a capping layer disposed on the second electrode.

In an embodiment, the display panel may include a first region overlapping the light emitting element, a second region spaced apart from the first region, and not overlapping the light emitting element, and a bending region disposed between the first region and the second region, and having a predetermined radius of curvature, where the protection member may overlap the first region, and may not overlap the bending region.

In an embodiment, the display device may further include a bending protection layer disposed on the display panel, and overlapping the bending region, where a side surface of the protection member may be in contact with the bending protection layer.

In an embodiment of the invention, a display device includes a display panel, a sensor layer disposed on the display panel, an anti-reflection layer disposed on the sensor layer, where the anti-reflection layer includes a colorant, and a protection member disposed on the anti-reflection layer, where the display panel includes a base substrate, a light emitting element disposed on the base substrate, and an encapsulation layer disposed on the light emitting element, where the protection member includes a base layer, and a hard coating layer disposed on at least one selected from an upper surface and a lower surface of the base layer, where the hard coating layer has a light transmittance of about 10% or less for light in a wavelength region of about 380 nm to about 410 nm, and has a light transmittance of about 85% or greater for light in a wavelength region of about 430 nm to about 480 nm.

In an embodiment, a thickness of the hard coating layer may be in a range of about 1 μm to about 15 μm, and a thickness of the base layer may be in a range of about 20 μm to about 60 μm, where a sum of the thickness of the hard coating layer and the thickness of the base layer may be about 25 μm or greater.

In an embodiment of the invention, a protection film includes a base layer, and a protection layer disposed on one surface of the base layer, where the protection layer includes a hard coating agent and an ultraviolet light absorber, where the protection film has a light transmittance of about 10% or less for light in a wavelength region of about 380 nm to about 410 nm, and has a Young's modulus of about 0.1 gigapascal (GPa) or greater.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1A:
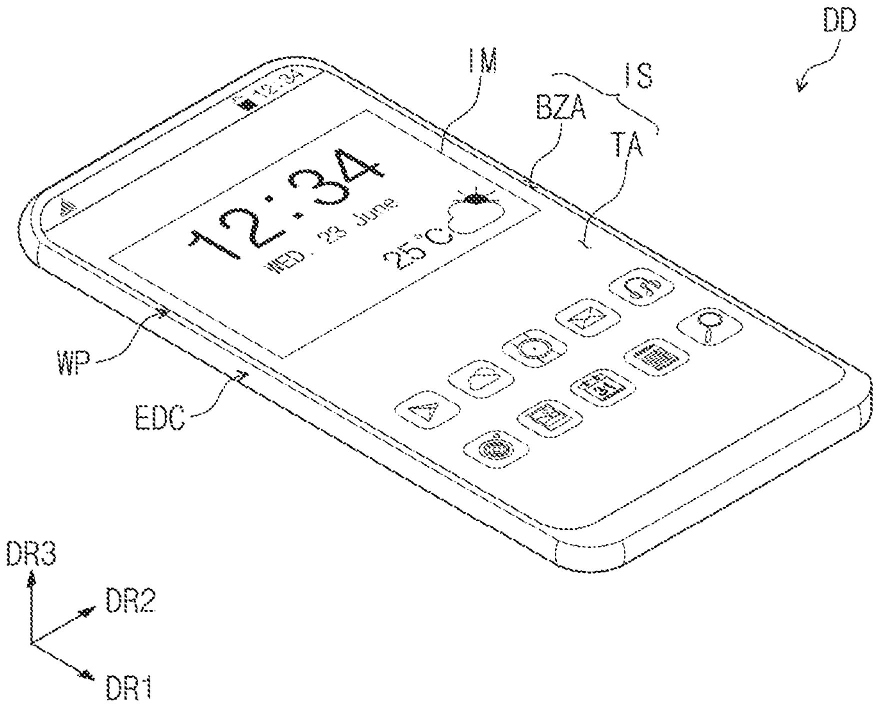
FIG. 1A is a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, when an element (or an area, a layer, a portion, etc.) is referred to as being "on," "connected to," or "coupled to" another element, it means that the element may be directly connected to/coupled to the other element, or that a third element may be disposed therebetween.

Like reference numerals refer to like elements. Also, in the drawings, the thickness, the ratio, and the dimensions of elements are exaggerated for an effective description of technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the invention. The terms of a singular form may include plural forms unless the context clearly indicates otherwise.

In addition, terms such as "below," "lower," "above," "upper," and the like are used to describe the relationship of components shown in the drawings. The terms are used as a relative concept and are described with reference to the direction indicated in the drawings.

It should be understood that the term "comprise," or "have" is intended to specify the presence of stated features, integers, steps, operations, elements, components, or combinations thereof in the disclosure, but do not preclude the presence or addition of one or more other features, integers, steps, operations, elements, components, or combinations thereof.

In the disclosure, being "directly disposed" may mean that there is no layer, film, region, plate, or the like added between a portion of a layer, a film, a region, a plate, or the like and other portions. For example, being "directly disposed" may mean being disposed without additional members such as an adhesive member between two layers or two members.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which the invention pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a display device according to an embodiment of the invention will be described with reference to the accompanying drawings.

Figure 1B:
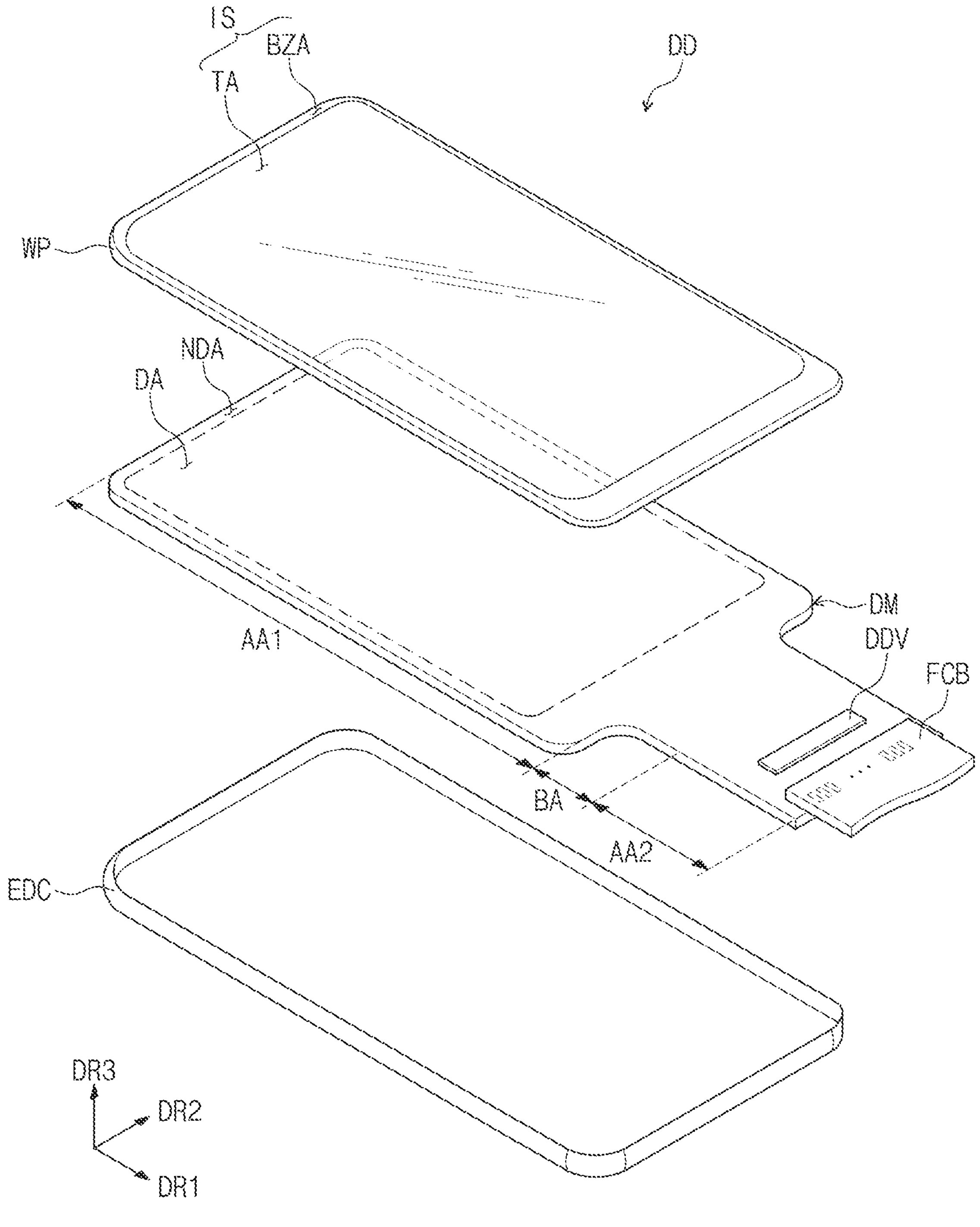
FIG. 1B is an exploded perspective view of the display device illustrated in FIG. 1A.

FIG. 1A is a perspective view of a display device according to an embodiment of the invention. FIG. 1B is an exploded perspective view of the display device illustrated in FIG. 1A.

An embodiment of a display device DD may be a device activated by an electrical signal. The display device DD may include various embodiments. In an embodiment, for example, the display device DD may be a personal computer, a notebook computer, a personal digital terminal, a car navigation system unit, a game console, a smart phone, a tablet computer, a camera, or the like. In addition, it should be understood that these are merely examples, and may be employed as other display devices without departing from the teachings herein. In FIGS. 1A and 1B, an embodiment where the display device DD is a smart phone is illustrated as an example.

In FIG. 1A and the following drawings, a first direction DR1 to a third direction DR3 are illustrated for convenience of description, and directions indicated by the first to third directions DR1, DR2, and DR3 described in the disclosure are a relative concept, and may be converted to different directions.

In the disclosure, for convenience of description, the third direction DR3 is defined as a direction in which an image IM is provided to a user. Also, the first direction DR1 and the second direction DR2 are perpendicular to each other, and the third direction DR3 may be a normal direction with respect to a plane defined by the first direction DR1 and the second direction DR2. The third direction DR3 may be a thickness direction of the display device DD. In the disclosure, "on a plane" may be defined as a state viewed in the third direction DR3. In the disclosure, "on a cross-section" may be defined as a state viewed in the first direction DR1 or the second direction DR2.

The display device DD may display the image IM toward the third direction axis DR3 direction on a display surface IS parallel to the plane defined by the first direction DR1 and the second direction DR2. The display surface IS on which the image IM is displayed may correspond to a front surface of the display device DD, and may correspond to a display surface IS of a window WP. Hereinafter, the same reference numeral will be used for the display surface and the front surface of the display device DD, and for the display surface of the window WP. The image IM may include a moving image as well as a still image. In an embodiment, as shown in FIG. 1A, an embodiment of the image IM may include a watch window and application icons.

FIG. 1A illustrates an embodiment of the display device DD having a planar display surface IS. However, the shape of the display surface IS of the display device DD is not limited thereto, and may be curved or three-dimensional.

The display device DD may be flexible. Being "flexible" refers to having properties of being able to be bent, which may include from a structure of being completely folded to a structure of being able to be bent to a degree of a few nanometers. In an embodiment, for example, the flexible display device DD may include a curved display device or a foldable display device. However, the embodiment of the invention is not limited thereto, and the display device DD may be rigid.

The display surface IS of the display device DD may be divided into a transmission region TA and a light blocking region BZA. The transmission region TA may be a region in which the image IM is displayed. A user may visually recognize the image IM the transmission region TA. In an embodiment, as shown in FIGS. 1A and 1B, the transmission region TA may have a quadrangular shape with rounded vertices, but this is only an example, and the transmission region TA may have various shapes.

The light blocking region BZA may be a region which has a predetermined color and blocks light. The light blocking region BZA may be adjacent to the transmission region TA. In an embodiment, for example, the light blocking region BZA may be disposed on an outer side of the transmission region TA, and surround the transmission region TA. Accordingly, the shape of the transmission region TA may be substantially defined by the light blocking region BZA. However, this is only illustrated as an example, and the light blocking region BZA may be adjacent to only one side of the transmission region TA, or may be omitted. In addition, the light blocking region BZA may be disposed on a side surface of the display device DD, not on the front surface thereof.

In an embodiment, the display device DD may sense an external input applied from the outside. The external input may have various forms such as pressure, temperature, and light provided from the outside. The external input may include not only an input which comes into contract with the display device DD (e.g., a contact by a user's hand or a pen), but also an input applied in close proximity to the display device DD (e.g., hovering).

Referring to FIG. 1A, an embodiment of the display device DD may include the window WP, and a case EDC. The window WP and the case EDC may be coupled to each other to configure the appearance of the display device DD, and to provide an internal space capable of accommodating components of the display device DD.

Referring to FIG. 1B, an embodiment of the display device DD may include the window WP, the display module DM, a driving chip DDV, a printed circuit board FCB, and the case EDC.

Referring to FIG. 1B, the display module DM may include a display region DA and a non-display region NDA around the display region DA. The display region DA and the non-display region NDA may be distinguished by whether there is a pixel PX (see FIG. 3) therein. The display region DA and the non-display region NDA may respectively correspond to the transmission region TA and the light blocking region BZA of FIG. 1A. As used herein, the sentence "a region/portion corresponds to a region/portion" means that "they overlap each other" and is not limited to having the same area and/or the same shape.

Figure 5:
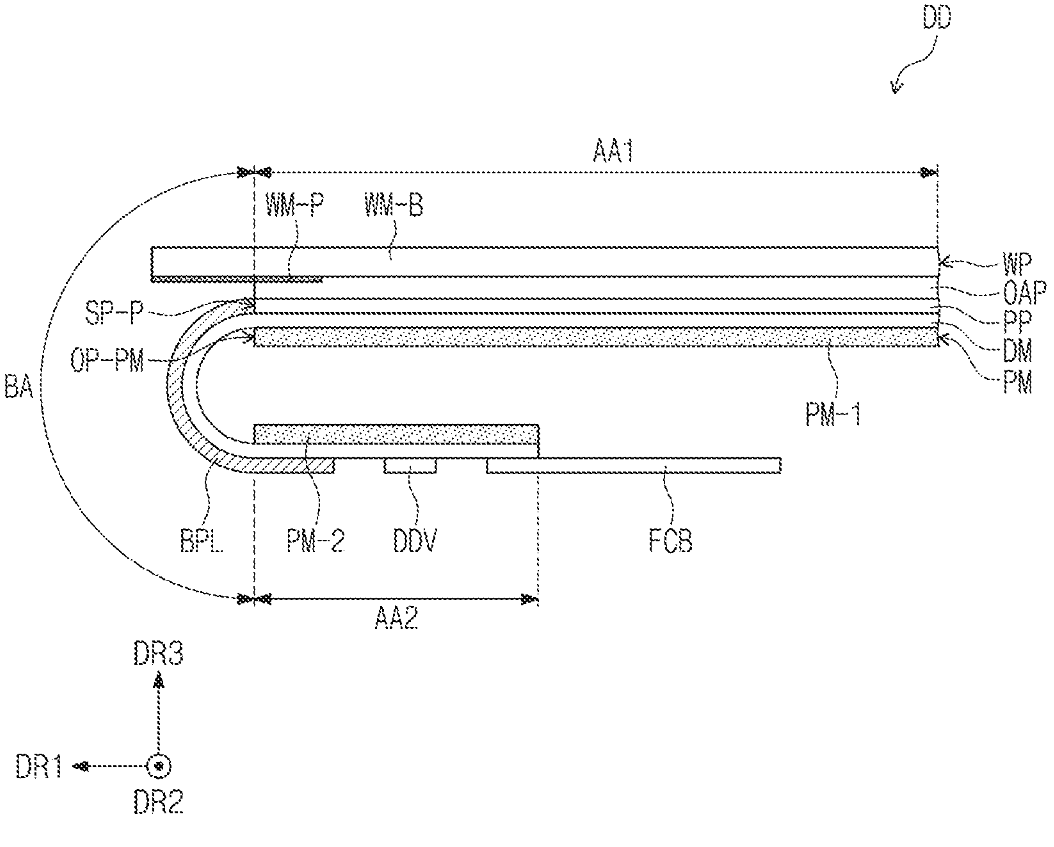
FIG. 5 is a cross-sectional view of a display device according to an embodiment of the invention.

The display module DM may include a first region AA1, a bending region BA, and a second region AA2, which are distinguished from each other in the first direction DR1. The first region AA1, the bending region BA, and the second region AA2 may be arranged along the first direction DR1. The bending region BA may extend from the first region AA1 along the first direction DR1, and the second region AA2 may extend from the bending region BA along the first direction DR1. In an embodiment of the display device DD as assembled as shown in FIG. 1A, the display module DM mounted on the display device DD may be disposed on a plane different from the first region AA1 and the second region AA2, as illustrated in FIG. 5. The bending region BA may be disposed between the first region AA1 and the second region AA2. The bending shape of the bending region BA will be described later with reference to FIG. 5. FIG. 1B illustrates the display module DM in an unfolded state before being mounted on the display device DD. The first region AA1 may be a region corresponding to the display surface IS of FIG. 1A.

In the second direction DR2, the length of the bending region BA and the second region AA2 may be less than the length of the first region AA1. However, shapes of the first region AA1, the bending region BA, and the second region AA2 are not limited thereto.

The display region DA of the display module DM may be defined in the first region AA1. The display region DA may be a region configured to be activated based on an electrical signal and to emit an image. The display region DA may correspond to the transmission region TA of FIG. 1A. An image displayed in the display region DA may be visually recognized from the outside through the transmission region TA.

The non-display region NDA may be adjacent to the display region DA. In an embodiment, for example, the non-display region NDA may surround the display region DA. However, the embodiment of the invention is not limited thereto, and the non-display region NDA may be defined in various shapes. The second region AA2 and the bending region BA may be partial regions of the non-display region NDA. The non-display region NDA may correspond to remaining regions other than the display region DA defined in the first region AA1, the bending region BA, and the second region AA2.

The non-display region NDA may be a region in which a driving circuit or a driving line for driving the display region DA, various signal lines for providing an electrical signal, and pads are disposed. The non-display region NDA defined in the first region AA1 may correspond to the light blocking region BZA illustrated in FIG. 1A. Components of the display module DM disposed in the non-display region NDA may be prevented by the light blocking region BZA from being visually recognized from the outside.

The driving chip DDV may be disposed in the second region AA2 of the display module DM. The driving chip DDV may be manufactured in the form of an integrated circuit chip and mounted on the second region AA2.

The printed circuit board FCB may be disposed adjacent to one end of the second region AA2. The printed circuit board FCB may be disposed spaced apart from the driving chip DDV in the first direction DR1.

The printed circuit board FCB may include electronic elements mounted in the board. The electronic elements may be electrically connected though circuit lines. The printed circuit board FCB may be connected to pads disposed in the second region AA2, and be electrically connected to a display panel DP (see FIG. 3). In an embodiment, although not separately illustrated, the printed circuit board FCB may be electrically connected to a motherboard of an electronic module constituting the display device DD through a connector.

The window WP may be disposed on the display module DM. The window WP may protect the display module DM from an external impact. The window WP may include a transmission region TA and a light blocking region BZA. The display surface IS of the window WP including the transmission region TA and the bezel region BZA corresponds to the display surface IS of the display device DD. A user may visually recognize an image provided through the transmission region TA corresponding to the display surface IS of the display device DD.

In an embodiment, as shown in FIG. 1B, the transmission region TA may have a quadrangular shape with rounded vertices. However, this is only an example, and the transmission region TA may have various shapes, and is not limited to any one embodiment.

The transmission region TA may be an optically transparent region. The light blocking region BZA may be a region having a relatively low light transmittance compared with the transmission region TA. The light blocking region BZA may have a predetermined color. The light blocking region BZA may be adjacent to the transmission region TA, and may surround the transmission region TA. The light blocking region BZA may define the shape of the transmission region TA. However, the embodiment is not limited to those illustrated in the drawings, and the light blocking region BZA may be disposed adjacent to only one side of the transmission region TA, or a portion of the light blocking region BZA may be omitted. The window WP may include an optically transparent insulation material.

The case EDC may be disposed below the display module DM to accommodate the display module DM. The case EDC may absorb impacts applied from the outside, and may prevent foreign substances/moisture and the like from penetrating into the display module DM to protect the display module DM. In an embodiment, the case EDC may be provided in the form in which a plurality of receiving members are coupled to each other.

The display device DD may further include an electronic module including various functional modules for operating the display module DM, a power supply module for supplying power required for the display device DD, a bracket coupled to the display module DM and/or the case EDC to divide the internal space of display device DD, and the like.

The display device DD may be flexible. Being flexible refers to having properties of being able to be bent, which may include from a structure of being completely folded to a structure of being able to be bent to a degree of several nanometers. In an embodiment, for example, the display device DD may be a curved display device or a foldable display device. However, the embodiment of the invention is not limited thereto, and the display device DD may be rigid.

Figure 2:
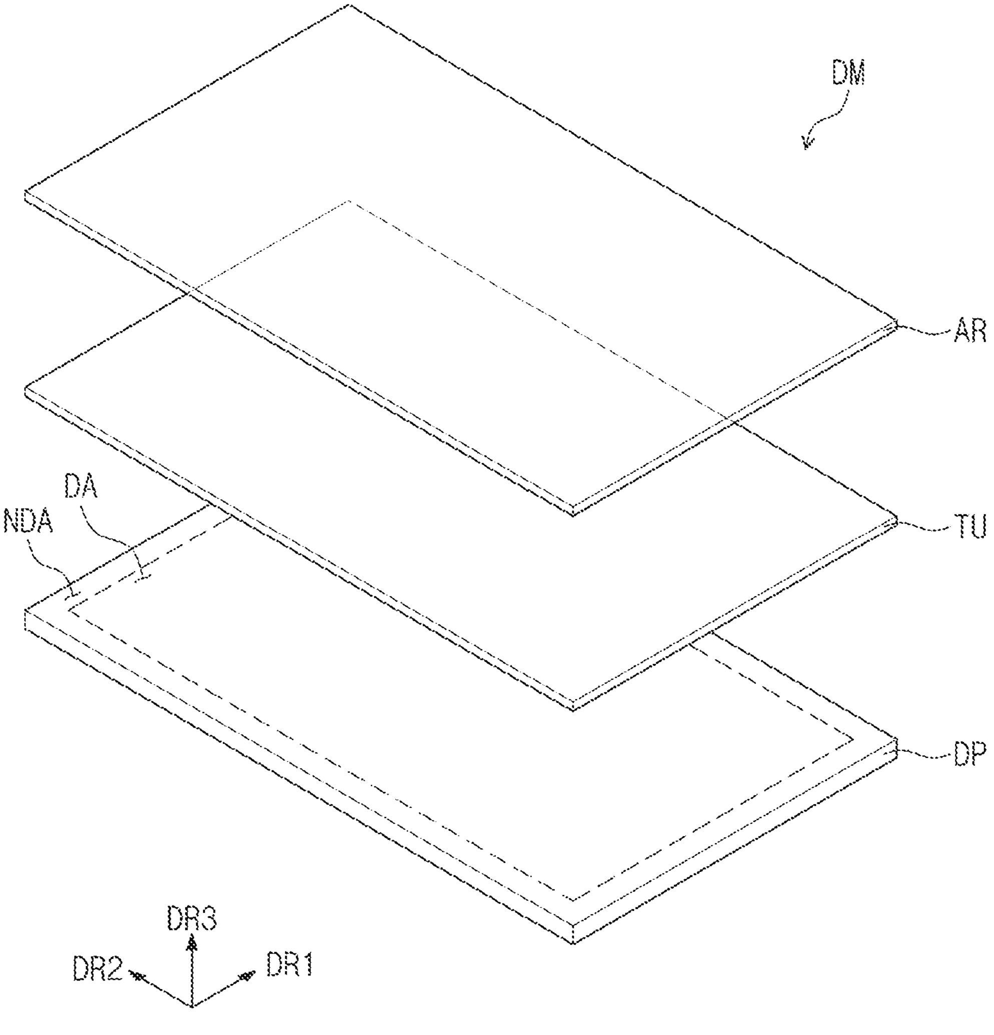
FIG. 2 is an exploded perspective view of a display module according to an embodiment of the invention.

FIG. 2 is an exploded perspective view of a display module according to an embodiment of the invention. Referring to FIG. 2, the display module DM according to an embodiment may include the display panel DP, a sensor layer TU, and an anti-reflection layer AR.

In an embodiment, the display panel DP may include a plurality of pixels in a region corresponding to the display device DD. The plurality of pixels may correspond to a plurality of light emitting regions PXA-R, PXA-G, and PXA-B (see FIG. 6). The plurality of pixels may display light based on an electrical signal. In an embodiment, the display region DA may display the image IM generated by light emitted from the plurality of pixels.

The display panel DP according to an embodiment may be a self-luminous display panel. In an embodiment, for example, the display panel DP may be a micro light emitting diode (LED) display panel, a nano LED display panel, an organic light emitting display panel, or a quantum dot light emitting display panel. However, this is only an example, and the display panel DP is not limited as long as it is a self-luminous display panel.

A light emitting layer of the organic light emitting display panel may include an organic light emitting material. A light emitting layer of the quantum dot light emitting display panel may include quantum dots and/or quantum loads, and the like. The micro LED display panel may include a micro LED element, which is an ultra-small light emitting element, and the nano LED display panel may include a nano LED element. Hereinafter, for convenience of description, embodiments where the display panel DP is an organic light emitting display panel will be described.

The anti-reflection layer AR may be disposed on the display panel DP. The anti-reflection layer AR may be an anti-reflection layer which reduces the reflectance of external light incident from the outside. The anti-reflection layer AR may be a layer which selectively transmits light emitted from the display panel DP. In an embodiment, the anti-reflection layer AR may not include a polarizing layer. Accordingly, light incident through the anti-reflection layer AR to the display panel DP and the sensor layer TU may be unpolarized light. The display panel DP and the sensor layer TU may receive unpolarized light from an upper side of the anti-reflection layer AR.

The sensor layer TU may be disposed between the display panel DP and the anti-reflection layer AR. The sensor layer TU may acquire information for generating an image on the display panel DP by an external input. The external input may be a user input. The user input may include various forms of external inputs, such as a part of a user's body, light, heat, a pen, a pressure, or the like.

The sensor layer TU may be directly disposed on the display panel DP. The sensor layer TU may be directly disposed on an encapsulation layer TFE (see FIG. 4) which defines the uppermost layer of the display panel DP. As used herein, "Component A is directly disposed on Component B" means that no adhesive layer is disposed between Component A and Component B. In the embodiment, the sensor layer TU and the encapsulation layer TFE may be manufactured in a continuous process. However, the invention of the invention is not limited thereto, and the sensor layer TU may be provided as an individual panel, and be coupled to the display panel DP through an adhesive layer. As another example, the sensor layer TU may be omitted.

Figure 3:
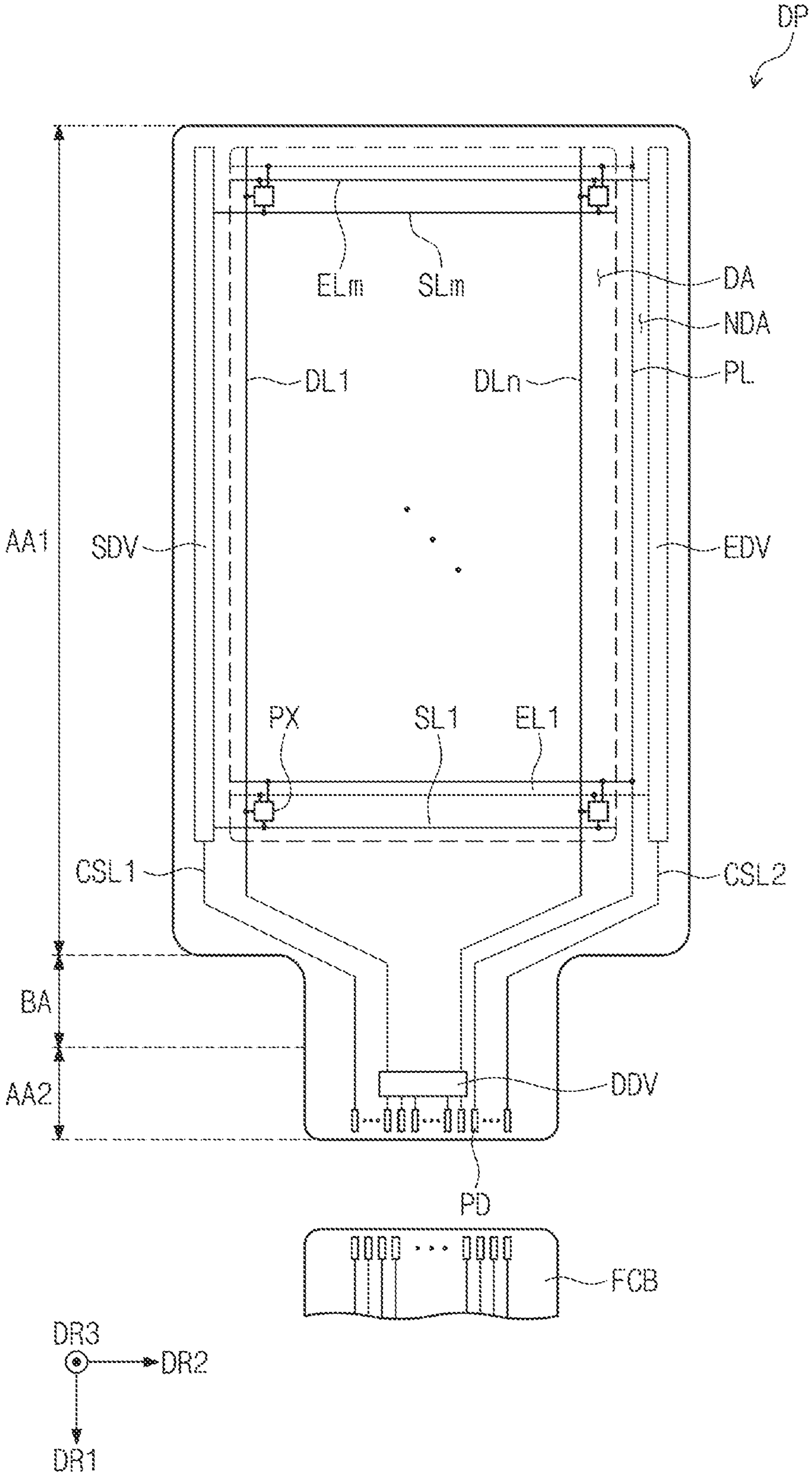
FIG. 3 is a plan view of a display panel according to an embodiment of the invention.
Figure 4:
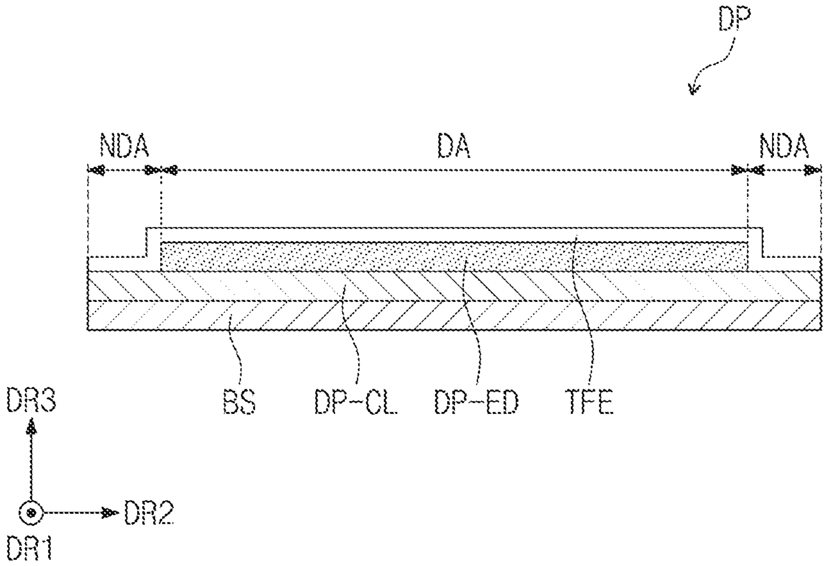
FIG. 4 is a cross-sectional view of a display panel according to an embodiment of the invention.

FIG. 3 is a plan view of a display panel according to an embodiment of the invention. FIG. 4 is a cross-sectional view of a display panel according to an embodiment of the invention.

Referring to FIG. 3, an embodiment of the display panel DP may include a plurality of pixels PX disposed in the display region DA and a plurality of signal lines electrically connected to the pixels PX. The display panel DP may include a plurality of pads PD disposed in the non-display region NDA, a scan driver SDV, and an emission driver EDV.

Each of the pixels PX may include a pixel driving circuit including a light emitting element, a plurality of transistors (e.g., a switching transistor, a driving transistor, etc.) connected to the light emitting element, and a capacitor, all of which are to be described later. Each of the pixels PX may emit light in correspondence to an electrical signal applied thereto.

The plurality of signal lines may include scan lines SL1 to SLm, data lines DL1 to DLn, emission lines EL1 to ELm, first and second control lines CSL1 and CSL2, a power line PL. Here, m and n each represent a natural number. Each of the pixels PX may be connected to a corresponding scan line among the scan lines SL1 to SLm and a corresponding data line among the data lines DL1 to DLn. In an embodiment, depending on the configuration of the pixel driving circuit of the pixels PX, more types of signal lines may be provided in the display panel DP.

The scan driver SDV and the emission driver EDV may be disposed in the non-display region NDA. The scan driver SDV and the emission driver EDV may be disposed adjacent to long sides of the non-display region NDA of the first region AA1, respectively.

The scan lines SL1 to SLm may extend in the second direction DR2 and be connected to the scan driver SDV. The data lines DL1 to DLn may extend in the first direction DR1, and be connected to the driving chip DDV via the bending region BA. The emission lines EL1 to ELm may extend in the second direction DR2 and be connected to the emission driver EDV.

The power line PL may extend in the first direction DR1 and be disposed between the display region DA and the emission driver EDV. However, the embodiment of the invention is not limited thereto, and the power line PL may be disposed between the display region DA and the scan driver SDV. The power line PL may extend to the second region AA2 via the bending region BA. The power line PL may be connected to a corresponding pad PD among the pads disposed at a lower end of the second region AA2 to receive a voltage. The power line PL may provide a reference voltage to the pixels PX through connection lines.

The data lines DL1 to DLn may be connected to corresponding pads PD through the driving chip DDV. In an embodiment, for example, the data lines DL1 to DLn may be connected to the driving chip DDV, and the driving chip DDV may be connected to pads PD respectively corresponding to the data lines DL1 to DLn.

The pads PD may be arranged along one direction on the non-display region NDA of the second region AA2. The pads PD may be disposed adjacent to an end extended in the first direction DR1 of the second region AA2, and be arranged along the second direction DR2. The pads PD may be portions connected to the printed circuit board FCB. The pads PD may each be connected to a corresponding signal line among the plurality of signal lines.

The printed circuit board FCB may be connected to the pads PD to control the operation of the scan driver SDV, the emission driver EDV, and the driving chip DDV. The printed circuit board FCB may be a board on which a timing controller provided in the form of an integrated circuit chip is mounted. The timing controller may generate a scan control signal, a data control signal, and an emission control signal in response to control signals received from the outside.

The scan driver SDV may generate a plurality of scan signals in response to the scan control signal. The scan signals may be applied to the pixels PX through the scan lines SL1 to SLm. A data driver of the driving chip DDV may generate a plurality of data voltages corresponding to image signals in response to the data control signal. The data voltages may be applied to the pixels PX through the data lines DL1 to DLn. The emission driver EDV may generate a plurality of emission signals in response to the emission control signal. The emission signals may be applied to the pixels PX through the emission lines EL1 to ELm.

The pixels PX may be provided with the data voltages in response to the scan signals. The pixels PX may display an image by emitting light of luminance corresponding to the data voltages in response to an emission signal. An image may be output through the display region DA defined in the first region AA1 by the pixels PX.

A plurality of signal lines extended from the first region AA1 to the second region AA2 may be disposed on the bending region BA of the display panel DP. In an embodiment, the bending region BA may be covered with a bending protection layer BPL (see FIG. 5A), the plurality of signal lines disposed on the bending region BA may be effectively prevented from being damaged by an external impact.

Referring to FIG. 4, the display panel DP may include a base substrate BS, a circuit layer DP-CL disposed on the base substrate BS, a display element layer DP-ED, and an encapsulation layer TFE. The display panel DP may include a display region DA and a non-display region NDA. The display region DA of the display panel DP may correspond to the transmission region TA illustrated in FIG. 1A, and the non-display region NDA may correspond to the light blocking region BZA illustrated in FIG. 1A.

The base substrate BS may include at least one plastic film. The base substrate BS is a flexible substrate, and may include a plastic substrate, a glass substrate, a metal substrate, an organic/inorganic composite material substrate, or the like.

The circuit layer DP-CL may include at least one intermediate insulation layer and a circuit element. The intermediate insulation layer may include at least one intermediate inorganic film and at least one intermediate organic film. The circuit element may include signal lines, a driving circuit of a pixel driving, or the like. The display element layer DP-ED includes at least one display element.

The display element included in the display element layer DP-ED may be various light emitting elements, and may be a light emitting element including an LCD, an LED, a micro-LED, a nano-LED, a quantum dot, a quantum rod, or the like, which are non-limiting examples thereof. Hereinafter, for convenience of description, embodiments in which the display element is an organic light emitting element will be described. The display element layer DP-ED may further include an organic layer such as a pixel definition film.

The encapsulation layer TFE may be disposed on the display element layer DP-ED. The encapsulation layer TFE may seal the display element layer DP-ED. The encapsulation layer TFE may be a thin film encapsulation layer. The encapsulation layer TFE may protect the display element layer DP-ED from foreign materials such as moisture, oxygen, and dust particles. The encapsulation layer TFE may include a plurality of thin films. The plurality of thin films may include a thin film encapsulation layer. The thin film encapsulation layer may have a stacking structure of an inorganic film/an organic film/an inorganic film. However, the embodiment of the invention is not limited thereto, and an encapsulation substrate may be provided instead of the encapsulation layer TFE. In an embodiment, the encapsulation substrate faces the base substrate BS, and the circuit layer DP-CL and the display element layer DP-ED may be disposed between the encapsulation substrate and the base substrate BS. In such an embodiment, the display device DD may include a sealant which couples the base substrate BS and the encapsulation substrate.

FIG. 5 is a cross-sectional view of a display device according to an embodiment of the invention. FIG. 5 is a cross-sectional view showing a state in which a portion of the display module illustrated in FIG. 1B is bent. The same or like elements shown in FIG. 5 are labeled with the same reference characters as used above to describe the embodiments shown in FIGS. 1A to 4, and any repetitive detailed description thereof will hereinafter be omitted or simplified.

Referring to FIG. 5, the window WP may include a base member WM-B, and a light blocking pattern WM-P. The base member WM-B may include an optically transparent insulation material. In an embodiment, for example, the base member WM-B may include glass, sapphire, or plastic.

The window WP may be disposed on the display panel DP. The window WP may be a component through which an image is actually visually recognized from the outside. In this specification, the window WP may define an upper surface of the display device DD, and may be a cover window for covering the display module DM.

The light blocking pattern WM-P may be a color layer provided on one surface of the base member WM-B. In an embodiment, the light blocking pattern WM-P may be provided on a lower surface of the base member WM-B. The light blocking pattern WM-P may be formed by depositing, printing, or coating a base material, in which dyes or pigments are mixed, on the base member WM-B. One region of the base member WM-B which does not overlap the light blocking pattern WM-P may correspond to the transmission region TA (see FIG. 1B).

The light blocking pattern WM-P may include a material having a predetermined color. In an embodiment, for example, the light blocking pattern WM-P may include a colored organic layer. The light blocking pattern WM-P may have a single-layered or multi-layered structure. The light blocking pattern WM-P having a multi-layered structure may include a color layer of a chromatic color and a light blocking layer of an achromatic color (black, in particular). The light blocking pattern WM-P may prevent components of the display device DD disposed to overlap the light blocking pattern WM-P from being visually recognized from the outside.

The window WP may be coupled to the display panel DP by a window adhesive layer OAP disposed between the window WP and the display module DM. The window adhesive layer OAP may include a clear adhesive such as an optically clear adhesive (OCA) film, an optically clear resin (OCR), or a pressure sensitive adhesive (PSA) film. However, the type of the adhesive included in the window adhesive layer OAP is not limited thereto.

The display module DM may include the first region AA1, the bending region BA, and the second region AA2. The bending region BA may extend from the first region AA1. The second region AA2 may extend from the bending region BA.

The bending region BA may be a region bent to a predetermined curvature. In a process of manufacturing the display device DD, the bending region BA may be bent such that the second region AA2 overlaps the first region AA1 on a plane. As the bending region is bent, the second region AA2 may be disposed on a rear surface of the display panel DP corresponding to the first region AA1.

The bending region BA may be a region having a predetermined curvature in a bent state. The second region AA2 may be an opposing region facing the first region AA1 in a bent state. The bending region BA is adjacent to the first region AA1, and may be a region substantially bent. The second region AA2 is adjacent to the bending region BA, and may be a flat region without being bent. As the bending region BA of the display panel DP is bent, the second region AA2 may face the first region AA1. The printed circuit board FCB may be connected to the second region AA2 of the display module DM.

A panel protection member PM may be disposed below the display panel DP. The panel protection member PM may be disposed corresponding to the first region AA1 and the second region AA2. The panel protection member PM may not be disposed in the bending region BA. In the panel protection member PM, an opening OP-PM overlapping the bending region BA may be defined. The opening OP-PM may be formed by removing a portion of the panel protection member PM. The panel protection member PM may include an upper surface adjacent to the display panel DP and a lower surface opposing the upper surface. The panel protection member PM may include a first protection member PM-1 and a second protection member PM-2 separated with the opening OP-PM interposed therebetween. The first protection member PM-1 may be disposed overlapping the first region AA1 of the display panel DP. The second protection member PM-2 may be disposed overlapping the second region AA2 of the display panel DP. The panel protection member PM may not be disposed in the bending region BA of the display panel DP.

In a case where the panel protection member PM is disposed to overlap the bending region BA, the thickness of the bending region BA of the display panel DP may increase, thereby the bending of the bending region BA being difficult. In an embodiment, since the opening OP-PM is defined in the panel protection member PM so that the panel protection member PM is not disposed in the bending region BA, the bending region BA of the display panel DP may be easily bent. In an embodiment, since the panel protection member PM is removed from the bending region BA, stress generated in the bending region BA during bending may be reduced.

The panel protection member PM is disposed below the display module DM, and thus may protect the display module DM. The panel protection member PM may include a flexible plastic material. In an embodiment, for example, the panel protection member PM may include at least one of polyethylene terephthalate or polyimide. However, the material of the panel protection member PM is not limited thereto.

The bending region BA may be bent such that the second region AA2 is disposed below the first region AA1. Therefore, the driving chip DDV may be disposed below the first region AA1. That is, the first region AA1 and the second region AA2 may be disposed on different planes (or reference surfaces) from each other. The bending region BA may be bent to protrude in a horizontal direction on a cross-section. The bending region BA may have a predetermined curvature and a predetermined radius of curvature. The radius of curvature may be in a range of about 0.1 millimeter (mm) to about 0.5 mm. However, the embodiment of the invention is not limited thereto.

A bending protection layer BPL may be bent together with the bending region BA. The bending protection layer BPL protects the bending region BA from an external impact, and may control a neutral plane of the bending region BA. The bending protection layer BPL may be attached to the bending region BA such that signal lines disposed in the bending region BA are closer to the neutral plane.

A protection member PP may be disposed between a window adhesive layer OAP and the display module DM. The protection member PP may serve to block ultraviolet light incident from the outside and protect functional layers disposed on a lower side of the protection member PP against an external impact. In an embodiment, a side surface SP-P adjacent to the bending region BA of the protection member PP may be in contact with the bending protection layer BPL. That is, a side surface of the bending protection layer BPL may be in contact with the side surface SP-P of the protection member PP. The protection member PP according to an embodiment will be described in greater detail later.

The bending protection layer BPL may be disposed at least in the bending region BA. The bending protection layer BPL may overlap the bending region BA and the second region AA2. The bending protection layer BPL may be disposed on a portion of the second region AA2. The bending protection layer BPL may be disposed spaced apart from the driving chip DDV disposed in the second region AA2. However, the embodiment of the invention is limited thereto, and the bending protection layer BPL may be disposed covering the driving chip DDV on the second region AA2. In addition, the bending protection layer BPL may cover a portion of the printed circuit board FCB disposed in the second region AA2. However, the embodiment of the invention is not limited thereto.

In an embodiment, the bending protection layer BPL may be formed by applying a resin composition for forming the bending protection layer BPL on the display module DM provided with the protection member PP, and then curing the resin composition. The protection member PP may serve to block the resin composition from overflowing over the protection member PP when the resin composition is provided on the display module DM. That is, the protection member PP may serve as a dam for blocking the resin composition for forming the bending protection layer BPL. Accordingly, the resin composition may be effectively prevented from spreading widely on the display module DM, and as a result, the bending protection layer BPL having a uniform thickness may be formed.

FIG. 5 illustrates an embodiment where the bending protection layer BPL overlaps the bending region BA and the second region AA2, and does not overlap the first region AA1, but the embodiment of the invention is not limited thereto, and the bending protection layer BPL may overlap a portion of the first region AA1. In an embodiment, a portion of the bending protection layer BPL overlapping the first region AA1 of the display module DM may not overlap the protection member PP on a plane. The bending protection layer BPL may include a first protection portion overlapping the first region AA1, a second protection portion overlapping the bending region BA, and a third protection portion overlapping the second region AA2, where the first protection portion of the bending protection layer BPL may not overlap the protection member PP on a plane. In an embodiment, for example, the first protection portion of the bending protection layer BPL may be disposed adjacent to the protection member PP to contact the side surface SP-P of the protection member PP, and may not overlap the protection member PP on a plane.

Figure 6:
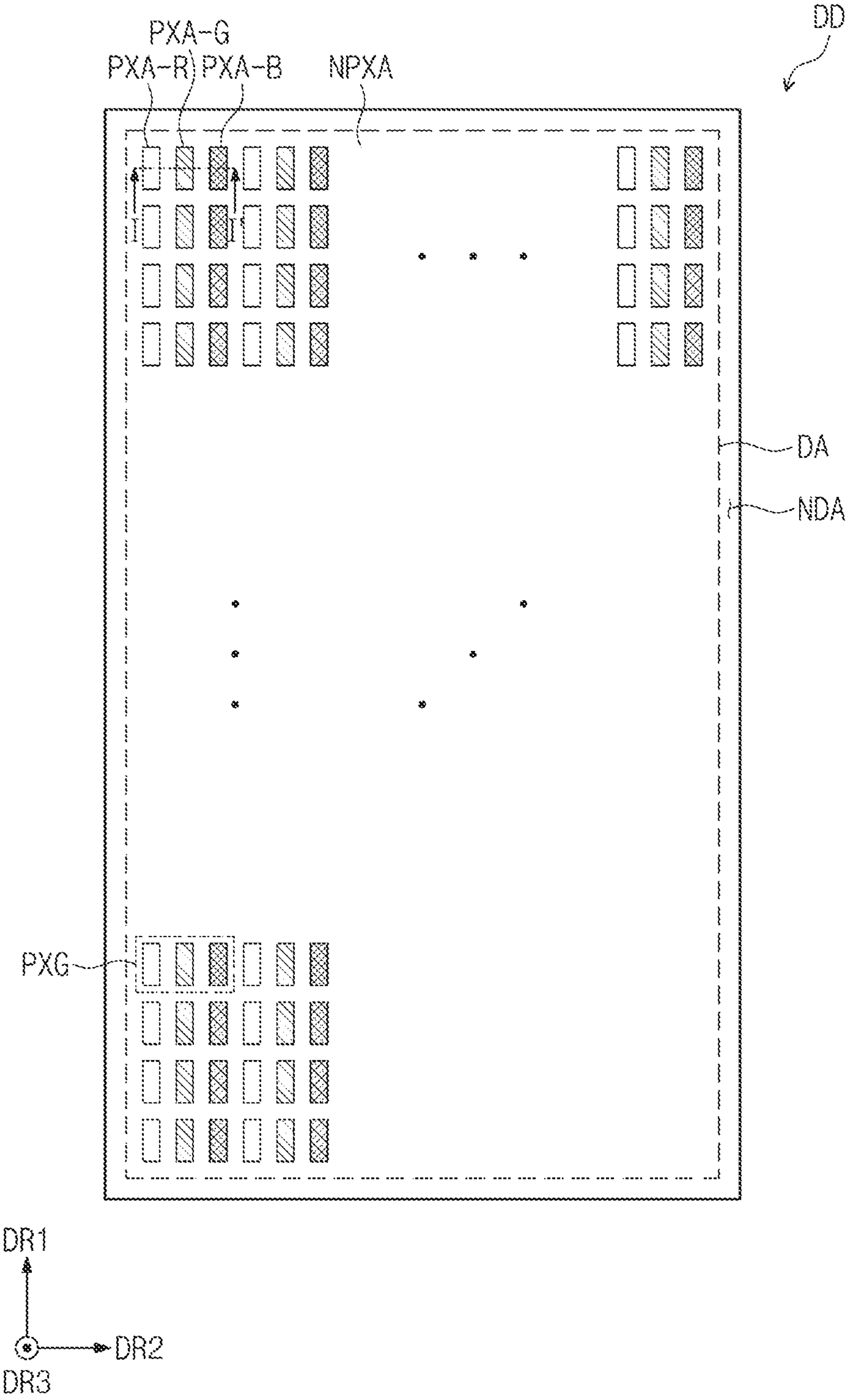
FIG. 6 is a plan view of a display device according to an embodiment of the invention.
Figure 7:
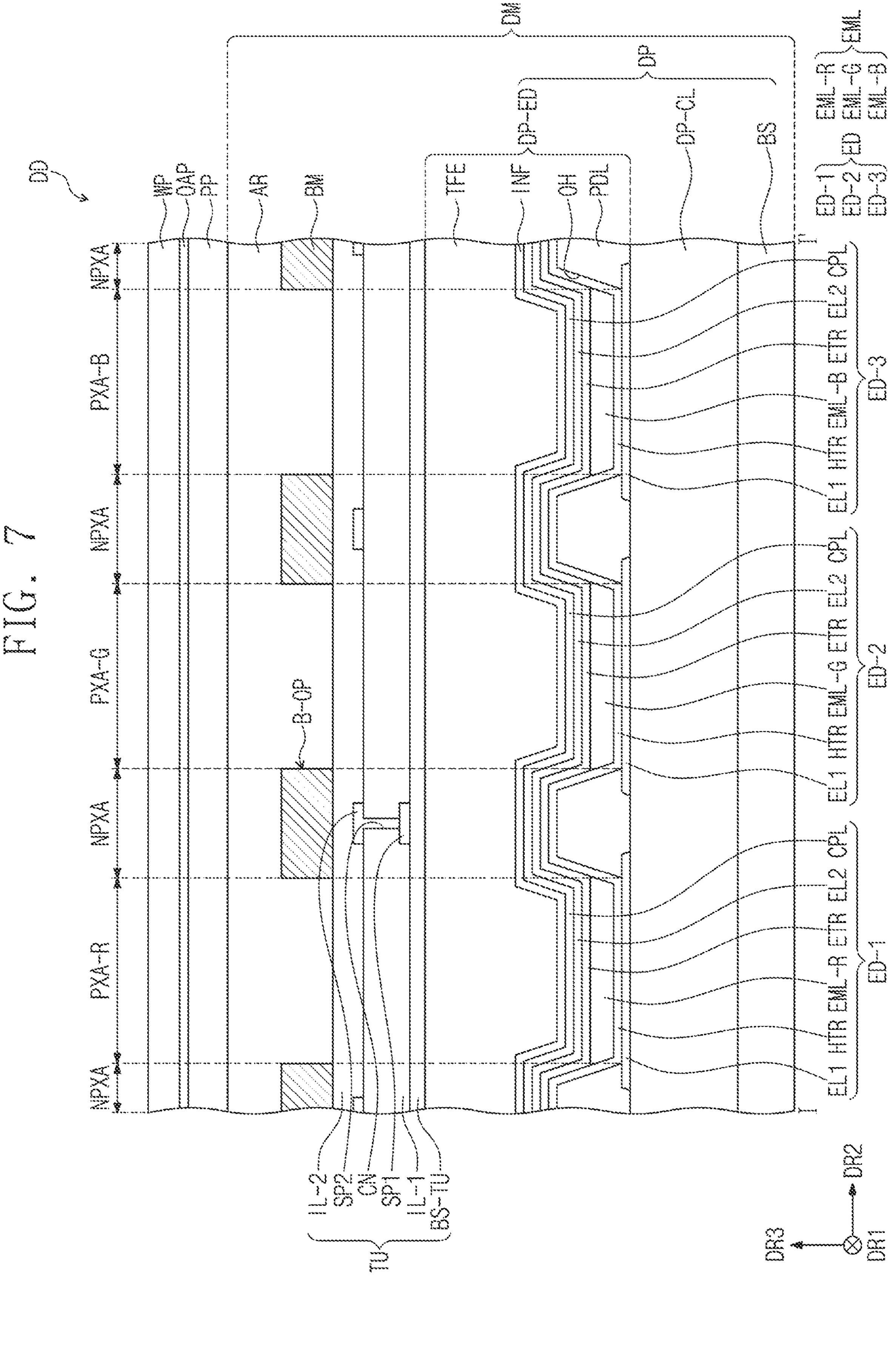
FIG. 7 is a cross-sectional view of a display device according to an embodiment of the invention.

FIG. 6 is a plan view of a display device according to an embodiment of the invention. FIG. 7 is a cross-sectional view of a display device according to an embodiment of the invention. FIG. 7 is a cross-sectional view of a portion taken along line I-I' of FIG. 6 in the display device according to an embodiment. The same or like elements shown in FIGS. 6 and 7 are labeled with the same reference characters as used above to describe the embodiments shown in FIGS. 1A to 5, and any repetitive detailed description thereof will hereinafter be omitted or simplified.

Referring to FIG. 6 and FIG. 7, a display device DD according to an embodiment includes a display panel DP, a sensor layer TU disposed on the display panel DP, and an anti-reflection layer AR disposed on the sensor layer TU.

The display panel DP may include a base substrate BS, a circuit layer DP-CL, and a display element layer DP-ED, which are sequentially stacked. The display element layer DP-ED may include a pixel definition film PDL, light emitting elements ED disposed in a pixel opening OH defined in the pixel definition film PDL, and an encapsulation layer TFE disposed on the light emitting elements ED.

The base substrate BS may be rigid or flexible. The base substrate BS may be a polymer substrate, a plastic substrate, a glass substrate, a metal substrate, a composite material substrate, or the like. The base substrate BS may have a multi-layered structure or a single-layered structure. The base substrate BS may include a synthetic resin film, and the base substrate BS may have a multi-layered structure including a plurality of synthetic resin film layers. The synthetic resin film may include polyimide-based, acrylic-based, vinyl-based, epoxy-based, urethane-based, cellulose-based, perylene-based, or the like, but the synthetic resin film material is not limited to the above examples.

The circuit layer DP-CL may be disposed on the base substrate BS. The circuit layer DP-CL may include an insulation layer, a semiconductor pattern, a conductive pattern, a signal line, or the like. The circuit layer DP-CL may include a plurality of transistors (not shown) formed of a semiconductor pattern, a conductive pattern, a signal line, or the like. The transistors (not shown) may each include a control electrode, an input electrode, and an output electrode. In an embodiment, for example, the circuit layer DP-CL may include a switching transistor and a driving transistor for driving the light emitting element ED.

The display element layer DP-ED may be disposed on the circuit layer DP-CL. The display element layer DP-ED may include the pixel definition film PDL, the light emitting element ED, and the encapsulation layer TFE.

The light emitting element ED may include a plurality of light emitting elements ED-1, ED-2, and ED-3. Each of the light emitting elements ED-1, ED-2, and ED-3 may include a first electrode EL1, a hole transport region HTR, a light emitting layer EML-R, EML-G, or EML-B, an electron transport region ETR, a second electrode EL2, and a capping layer CPL. A first light emitting element ED-1 may include a first light emitting layer EML-R overlapping a first light emitting region PXA-R. A second light emitting element ED-2 may include a second light emitting layer EML-G overlapping a second light emitting region PXA-G. A third light emitting element ED-3 may include a third light emitting layer EML-B overlapping a third light emitting region PXA-B.

The pixel definition film PDL may be disposed on the circuit layer DP-CL. In an embodiment, predetermined pixel openings OH may be defined through the pixel definition film PDL. The pixel openings OH defined in the pixel definition film PDL may respectively correspond to the plurality of light emitting regions PXA-R, PXA-G, and PXA-B. A peripheral region NPXA is a region between neighboring light emitting regions PXA-R, PXA-G, and PXA-B, and may be a region corresponding to the pixel definition film PDL.

The pixel definition film PDL may include an organic resin or an inorganic substance. In an embodiment, for example, the pixel definition film PDL may include or be formed of a polyacrylate-based resin, a polyimide-based resin, silicon nitride ($SiN_x$), silicon oxide ($SiO_x$), silicon nitride ($SiO_xN_y$), or the like.

FIG. 7 illustrates an embodiment in which the light emitting layers EML-R, EML-G, and EML-B of the light emitting elements ED-1, ED-2, and ED-3 are disposed in the pixel opening OH defined in the pixel definition film PDL, and the hole transport region HTR, the electron transport region ETR, the second electrode EL2, and the capping layer CPL are provided as a common layer throughout the light emitting elements ED-1, ED-2, and ED-3. However, the embodiment of the invention is not limited thereto, and in an alternative embodiment, the hole transport region HTR, the electron transport region ETR, the second electrode EL2, and the capping layer CPL may be patterned and provided inside the pixel opening OH defined on the pixel definition film PDL. In an embodiment, at least one selected from the hole transport region HTR, the light emitting layers EML-R, EML-G, and EML-B, the electron transport region ETR, the second electrode EL2, and the capping layer CPL of the light emitting elements ED-1, ED-2, and ED-3 may be patterned and provided by an ink-jet printing method.

In the light emitting element ED, the first electrode EL1 may be disposed on the circuit layer DP-CL. The first electrode EL1 may be an anode or a cathode. In addition, the first electrode EL1 may be a pixel electrode. The first electrode EL1 may be a transmissive electrode, a transflective electrode, or a reflective electrode.

The hole transport region HTR may be disposed between the first electrode EL1 and a light emitting layer EML. The hole transport region HTR may include at least one of a hole injection layer, a hole transport layer, or an electron blocking layer. The hole transport region HTR may be disposed as a common layer to overlap the light emitting regions PXA-R, PXA-G, and PXA-B and the entire pixel definition film PDL separating and the light emitting regions PXA-R, PXA-G, and PXA-B. However, the embodiment of the invention is not limited thereto, and the hole transport region HTR may be patterned and provided to be separately disposed corresponding to each of the light emitting regions PXA-R, PXA-G, and PXA-B.

The light emitting layer EML may be disposed on the first electrode EL1. The light emitting layer EML may include the plurality of light emitting layers EML-R, EML-G, and EML-B. The first light emitting layer EML-R overlaps the first light emitting region PXA-R, and may emit first light.

The second light emitting layer EML-G overlaps the second light emitting region PXA-G, and may emit second light. The third light emitting layer EML-B overlaps the third light emitting region PXA-B, and may emit third light. In the light emitting elements ED-1, ED-2, and ED-3 according to an embodiment, the first light to the third light may be light having substantially different wavelength ranges from each other. In an embodiment, for example, the first light may be red light in a wavelength range of about 625 nanometers (nm) to about 675 nm. In an embodiment, for example, the second light may be green light in a wavelength range of about 500 nm to about 570 nm. In an embodiment, for example, the third light may be blue light in a wavelength range of about 430 nm to about 480 nm.

The electron transport region ETR may be disposed between the light emitting layer EML and the second electrode EL2. The electron transport region ETR may include at least one of an electron injection layer, an electron transport layer, or a hole blocking layer. The electron transport region ETR may be disposed as a common layer to overlap the light emitting regions PXA-R, PXA-G, and PXA-B and the entire pixel definition film PDL separating and the light emitting regions PXA-R, PXA-G, and PXA-B. However, the embodiment of the invention is not limited thereto, and the electron transport region ETR may be patterned and provided to be separately disposed corresponding to each of the light emitting regions PXA-R, PXA-G, and PXA-B.

The second electrode EL2 is provided on the electron transport region ETR. The second electrode EL2 may be a common electrode. The second electrode EL2 may be a cathode or an anode, but the embodiment of the invention is not limited thereto. In an embodiment, for example, when the first electrode EL1 is an anode, the second electrode EL2 may be a cathode, and when the first electrode EL1 is a cathode, the second electrode EL2 may be an anode. The second electrode EL2 may be a transmissive electrode, a transflective electrode, or a reflective electrode.

On the second electrode EL2, the capping layer CPL may be further disposed. The capping layer CPL may include or be defined by multilayers or a single layer. In an embodiment, the capping layer CPL may be an organic layer or an inorganic layer. In an embodiment, for example, where the capping layer CPL includes an inorganic substance, the inorganic substance may include an alkaline metal compound such as LiF, an alkaline earth metal compound such as $MgF_2$, SiON, $SiN_x$, $SiO_y$, or the like. In an embodiment, for example, where the capping layer CPL includes an organic substance, the organic substance may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-Tris(carbazol-9-yl)triphenylamine (TCTA), and the like, or may include an epoxy resin, or an acrylate such as a methacrylate. However, the embodiment of the invention is not limited thereto.

In an embodiment, the refractive index of the capping layer CPL may be about 1.6 or greater. In an embodiment, the refractive index of the capping layer CPL may be about 1.6 or greater for light in a wavelength region of about 550 nm to about 660 nm.

The encapsulation layer TFE may be disposed on the pixel definition film PDL to cover the light emitting element ED. The encapsulation layer TFE is disposed on the capping layer CPL, and may be disposed by filling a portion of the pixel opening OH. In an embodiment, as illustrated in FIG. 7, where the light emitting element ED includes an inorganic deposition layer INF, the encapsulation layer TFE may be disposed on the inorganic deposition layer INF. The encapsulation layer TFE protects the light emitting element ED from moisture and/or oxygen, and may serve to protect the light emitting element ED from foreign substances such as dust particles. Although the encapsulation layer TFE is illustrated as one layer in FIG. 7 for convenience of illustration, the encapsulation layer TFE may include at least one organic film or inorganic film, or may include an organic film and an inorganic film. In an embodiment, for example, the structure of the encapsulation layer TFE may be a structure in which an organic film and an inorganic film are alternately and repeatedly stacked, or an inorganic film, an organic film, and an inorganic film are sequentially stacked.

The inorganic film included in the encapsulation layer TFE may include, for example, a silicon nitride layer, a silicon oxynitride layer, a silicon oxide layer, a titanium oxide layer, an aluminum oxide layer, or the like, and is not particularly limited to the above examples. The organic film included in the encapsulation layer TFE may include an acrylic organic film, but is not particularly limited to the above example.

The display device DD may include the peripheral region NPXA and the light emitting regions PXA-R, PXA-G, and PXA-B. Each of the light emitting regions PXA-R, PXA-G, and PXA-B may be a region in which light generated from each of the light emitting elements ED-1, ED-2, and ED-3 is emitted. The light emitting regions PXA-R, PXA-G, and PXA-B may be spaced apart from each other on a plane.

Each of the light emitting regions PXA-R, PXA-G, and PXA-B may be a region separated by the pixel definition film PDL. The peripheral region NPXA is a region between neighboring light emitting regions PXA-R, PXA-G, and PXA-B, and may be a region corresponding to the pixel definition film PDL. In this specification, each of the light emitting regions PXA-R, PXA-G, and PXA-B may correspond to a pixel. The pixel definition film PDL may separate the light emitting elements ED-1, ED-2, and ED-3. The light emitting layers EML-R, EML-G, and EML-B of the light emitting elements ED-1, ED-2, and ED-3 may be disposed and separated in the pixel opening OH defined in the pixel definition film PDL.

The light emitting regions PXA-R, PXA-G, and PXA-B may be separated into a plurality of groups based on colors of light generated from the light emitting elements ED-1, ED-2, and ED-3. In an embodiment of the display device DD, as illustrated in FIG. 6 and FIG. 7, three light emitting regions PXA-R, PXA-G, and PXA-B may respectively emit red light, green light, and blue light. In an embodiment, for example, the display device DD may include the first light emitting region PXA-R, the second light emitting region PXA-G, and the third light emitting region PXA-B, which are separated from each other. In an embodiment, the first light emitting region PXA-R may be referred to as a red light emitting region PXA-R, the second light emitting region PXA-G may be referred to as a green light emitting region PXA-G, and the third light emitting region PXA-B may be referred to as a blue light emitting region PXA-B. In the display device DD according to an embodiment, one red light emitting region PXA-R, one green light emitting region PXA-G, and one blue light emitting region PXA-B may be collectively referred to as a unit pixel group PXG. Although not illustrated, at least one of the red light emitting region PXA-R, the green light emitting region PXA-G, and the blue light emitting region PXA-B included in the unit pixel group PXG may be provided in plurality. In an embodiment, for example, the unit pixel group PXG may include two green light emitting regions PXA-G, one red light emitting region PXA-R, and one blue light-emitting region PXA-B.

In the display device DD according to an embodiment, the plurality of light emitting elements ED-1, ED-2, and ED-3 may emit light of different wavelength regions. For example, in an embodiment, the display device DD may include the first light emitting element ED-1 which emits red light, the second light emitting element ED-2 which emits green light, and the third light emitting element ED-3 which emits blue light. That is, the red light emitting region PXA-R, the green light emitting region PXA-G, and the blue light emitting region PXA-B of the display device DD may respectively correspond to the first light emitting element ED-1, the second light emitting element ED-2, and the third light emitting element ED-3.

However, the embodiment of the invention is not limited thereto, and the first to third light emitting elements ED-1, ED-2, and ED-3 may emit light of the same wavelength region, or at least one thereof may emit light of a different wavelength region. In an embodiment, for example, the first to third light emitting elements ED-1, ED-2, and ED-3 may all emit blue light.

In the display device DD according to an embodiment, the light emitting regions PXA-R, PXA-G, and PXA-B may be arranged in a stripe shape. Referring to FIG. 6, a plurality of red light emitting regions PXA-R, a plurality of green light emitting regions PXA-G, and a plurality of blue light emitting regions PXA-B may each be aligned along the first direction DR1. In addition, the red light emitting region PXA-R, the green light emitting region PXA-G, and the blue light emitting region PXA-B may be alternately arranged in the above order along the second direction DR2.

In FIG. 6 and FIG. 7, the areas of the light emitting regions PXA-R, PXA-G, and PXA-B are illustrated as being all similar to each other, but the embodiment of the invention is not limited thereto, and the areas of the light emitting regions PXA-R, PXA-G, and PXA-B may be different from each other depending on the wavelength region of emitted light. Here, the areas of the light emitting regions PXA-R, PXA-G, and PXA-B may refer to the areas when viewed on a plane defined by the first direction DR1 and the second direction DR2 or viewed in the third direction DR3.

In embodiments, the arrangement type of the light emitting regions PXA-R, PXA-G, and PXA-B is not limited to what is illustrated in FIG. 6, and the order in which the red light emitting region PXA-R, the green light emitting region PXA-G, and the blue light emitting region PXA-B are arranged may be provided in various combinations depending on the characteristics of display quality required in the display device DD. In an embodiment, for example, the arrangement form of the light emitting regions PXA-R, PXA-G, and PXA-B may have the Pentile™ arrangement form, or the Diamond Pixel™ arrangement form.

In addition, the areas of the light emitting regions PXA-R, PXA-G, and PXA-B may be different from each other. For example, in an embodiment, the area of the green light emitting region PXA-G may be smaller than the area of the blue light emitting region PXA-B, but the embodiment of the invention is not limited thereto.

Referring back to FIG. 7, the display panel DP may include the inorganic deposition layer INF disposed on the light emitting elements ED-1, ED-2, and ED-3.

The inorganic deposition layer INF may be disposed on the capping layer CPL. The inorganic deposition layer INF may be directly disposed on the capping layer CPL. The inorganic deposition layer INF may be a layer for preventing external light from being reflected by the second electrode EL2 of the light emitting elements ED-1, ED-2, and ED-3. In such an embodiment, destructive interference may occur between light reflected from a surface of the inorganic deposition layer INF and light reflected from the second electrode EL2, so that the amount of external light reflected from a surface of the second electrode EL2 may be reduced. The thickness of the inorganic deposition layer INF and the thickness of the capping layer CPL may be controlled or determined in a way such that destructive interference occurs between the light reflected from the surface of the inorganic deposition layer INF and the light reflected from the second electrode EL2.

The inorganic deposition layer INF may include an inorganic material having a refractive index of 1.0 or greater and a light absorption coefficient of 0.5 or greater. The inorganic deposition layer INF may be formed through a thermal deposition process, and may include an inorganic material having a melting point of 1000° C. or lower. The inorganic deposition layer INF may include, for example, at least one selected from bismuth (Bi) or ytterbium (Yb). A material forming the inorganic deposition layer INF may be made of bismuth (Bi), made of ytterbium (Yb), or may be a $Yb_xBi_y$ mixed deposition material. The encapsulation layer TFE may be directly disposed on at least a portion of the inorganic deposition layer INF.

In an embodiment, the anti-reflection layer AR may be disposed on the display panel DP. The anti-reflection layer AR may overlap the entire display element layer DP-ED. The anti-reflection layer AR may entirely overlap each of the first light emitting element ED-1, the second light emitting element ED-2, and the third light emitting device ED-3. The anti-reflection layer AR may be provided as one continuous layer. The anti-reflection layer AR covers the front surface of the display panel DP, and may protect the display panel DP. The anti-reflection layer AR may absorb a portion of light emitted from the display panel DP, and may transmit a portion thereof, thereby improving color reproducibility. The color reproducibility refers to a range of colors which may be displayed by a display device. In an embodiment, for example, light in a specific wavelength region may be selectively absorbed to improve color reproducibility. In this specification, the anti-reflection layer AR may be referred to as a light control layer.

The anti-reflection layer AR disposed on the display panel DP does not include a polarizing layer, and may be a layer in which a dye and/or a pigment is dispersed in a base resin. As the anti-reflection layer AR does not include a polarizing layer, light incident on the display panel DP and the sensor layer TU passing through the anti-reflection layer AR may be unpolarized light. The display panel DP and the sensor layer TU may receive unpolarized light from an upper side of the anti-reflection layer AR.

The anti-reflection layer AR may have a high light absorption rate in a specific wavelength range. The anti-reflection layer AR may include at least one colorant. The anti-reflection layer AR may include a colorant having a high light absorption rate in a specific wavelength range. The colorant may have a high light absorption rate in at least one wavelength range. The colorant may be a material that absorbs light having a maximum absorption wavelength in a wavelength range other than the wavelength ranges of the first light, the second light, and the third light. In an embodiment, the colorant may be a material which absorbs light in a wavelength range of about 490 nm to about 505 nm, and light in a wavelength range of about 585 nm to about 600 nm, and which transmits light in the remaining wavelength ranges. The colorant may have a maximum absorption wavelength in a wavelength range of about 490 nm to about 505 nm and in a wavelength range of about 585 nm to about 600 nm. The colorant included in the anti-reflection layer AR absorbs light of a specific wavelength and transmits light of remaining wavelength regions, thereby preventing reflection by external light and adjusting the color of light emitted from the display panel DP.

The colorant may include at least one of a dye or a pigment. In an embodiment, for example, the colorant included in the anti-reflection layer AR may include at least one selected from an ahtalocyanine-based compound, a phtalocyanine-based compound, an azo-based compound, a perylene-based compound, a xanthene-based compound, a diimmonium-based compound, a dipyrromethene-based compound, a tetraazaporphyrin-based compound, a porphyrin-based compound, a squarylium-based compound, an oxazine-based compound, a triarylmethane-based compound, and a cyanine-based compound. In an embodiment, for example, the anti-reflection layer AR may include at least one selected from a tetraazaporphyrin-based compound, a cyanine-based compound, a squarylium-based compound, and an oxazine-based compound, or a combination thereof.

The anti-reflection layer AR may include a colorant in an amount of about 0.01 weight percent (wt %) to about 5.00 wt % based on the total weight of the anti-reflection layer AR. If the anti-reflection layer AR includes a colorant in an amount of less than about 0.01 wt %, light of a specific wavelength region is not sufficiently absorbed, so that it is not possible to improve color reproducibility. If the anti-reflection layer AR includes a colorant in an amount of greater than about 5.00 wt %, aggregation of the colorant may occur.

In an embodiment, the display device DD may further include a light blocking portion BM disposed on the display element layer DP-ED, covered by the anti-reflection layer AR, and overlapping the peripheral region NPXA. The light blocking portions BM may be disposed spaced apart from each other. The light blocking portion BM may prevent light leakage. The light blocking portion BM may be a light blocking member. The light blocking portion BM may include an organic light blocking material, a black pigment, a black dye, or the like.

The anti-reflection layer AR may fill gaps between the light blocking portions BM spaced apart from each other. A light blocking opening B-OP may be defined in the light blocking portion BM. The light blocking opening B-OP may correspond to the first to third light emitting regions PXA-R, PXA-G, and PXA-B. A portion of the anti-reflection layer AR may be disposed in the light blocking opening B-OP. The anti-reflection layer AR may be disposed on the light blocking portion BM while filling the light blocking opening B-OP.

In an embodiment, the sensor layer TU is disposed between the display panel DP and the anti-reflection layer AR. The sensor layer TU may include a sensor base layer BS-TU, a first conductive layer SP1, a first insulation layer IL-1, a second conductive layer SP2, and a second insulation layer IL-2. The first conductive layer SP1 may be disposed on the sensor base layer BS-TU. The first insulation layer IL-1 covers the first conductive layer SP1, and may be disposed on the sensor base layer BS-TU and the first conductive layer SP1. The second conductive layer SP2 may be disposed on the first insulation layer IL-1. The second insulation layer IL-2 covers the second conductive layer SP2, and may be disposed on the first insulation layer IL-1 and the second conductive layer SP2.

The sensor base layer BS-TU may be an inorganic layer including at least one selected from silicon nitride, silicon oxynitride, and silicon oxide. Alternatively, the sensor base layer BS-TU may be an organic layer including an epoxy resin, an acrylic resin, or an imide-based resin. The sensor base layer BS-TU may have a single-layered structure, or a multi-layered structure in which layers are stacked along the third direction DR3. The sensor base layer BS-TU may be directly disposed on the encapsulation layer TFE.

Each of the first conductive layer SP1 and the second conductive layer SP2 may have a single-layered structure, or a multi-layered structure in which layers are stacked along the third direction DR3. The conductive layers SP1 and SP2 of a single-layered structure may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), indium tin zinc oxide (ITZO), or the like. In addition, the transparent conductive layer may include a conductive polymer such as PEDOT, a metal nanowire, graphene, or the like.

The conductive layers SP1 and SP2 having a multi-layered structure may include metal layers. The metal layers may have, for example, a three-layered structure of titanium (Ti)/aluminum(Al)/titanium(Ti). The conductive layers SP1 and SP2 having a multi-layered structure may include at least one metal layer and at least one transparent conductive layer.

The first insulation layer IL-1 may be an inorganic insulation layer. The first insulation layer IL-1 may include at least one selected from aluminum oxide, titanium oxide, silicon oxide, silicon oxynitride, zirconium oxide, and hafnium oxide. However, the embodiment of the invention is not limited thereto.

In an embodiment, a contact hole CN may be defined in the first insulation layer IL-1. The first conductive layer SP1 and the second conductive layer SP2 may be electrically connected through the contact hole CN. The contact hole CN may be filled with a material of the second conductive layer SP2. Although FIG. 7 illustrates that one contact hole CN is defined through the first insulation layer IL-1, the embodiment of the invention is not limited thereto, and a plurality of contact holes may be defined in an inorganic insulation layer.

The second insulation layer IL-2 may be disposed on the first insulation layer IL-1. The second insulation layer IL-2 may cover the first insulation layer IL-1 and the second conductive layer SP2. The second insulation layer IL-2 may be an organic insulation film or an inorganic insulation film. In an embodiment, the second insulation layer IL-2 may include an organic insulation material. The organic insulation material may include at least one selected from an acrylic resin, a methacrylic resin, polyisoprene, a vinyl-based resin, an epoxy-based resin, a urethane-based resin, a cellulose-based resin, a siloxane-based resin, a polyimide-based resin, and a perylene-based resin. However, this is only an example, and the organic insulation material is not limited to the above examples.

A protection member PP may be disposed on the anti-reflection layer AR. The protection member PP may exhibit high optical properties. The protection member PP according to an embodiment may have a low light transmittance of about 10% or less (for light) in a wavelength range of about 380 nm to about 410 nm. In an embodiment, for example, the protection member PP may have a light transmittance of about 0% to about 10% in a wavelength range of about 380 nm to about 410 nm. In an embodiment, the protection member PP may have a low light transmittance of about 1% or less in a wavelength range of about 380 nm to about 400 nm. In an embodiment, for example, the protection member PP may have a light transmittance of about 0% to about 1% in a wavelength range of about 380 nm to about 400 nm. In addition, the protection member PP according to an embodiment may have a high transmittance of about 87% or greater in a visible light region of about 450 nm to about 1 micrometer (μm). In addition, the protection member PP may have a high transmittance of about 87% or greater in a visible light region of about 450 nm to about 780 nm.

The protection member PP may have a low haze value. In an embodiment, the haze value of the protection member PP may be about 1% or less. In an embodiment, for example, the haze value of the protection member PP may be in a range of about 0% to about 1%. However, the embodiment of the invention is not limited thereto. In such an embodiment where the haze value of the protection member PP is in the above-described range, high optical properties may be exhibited.

The protection member PP may have a Young's modulus at a room temperature (e.g., about 25° C.) of about 0.1 gigapascal (GPa) or greater. In an embodiment, for example, the Young's modulus of the protection member PP may be about 0.1 GPa to about 8 GPa. If the Young's modulus value of the protection member PP is less than about 0.1 GPa, sufficient strength is not secured to protect functional layers disposed on a lower side of the protection member PP, so that damage such as cracks of the protection member PP may occur in an impact strength test. In addition, if the Young's modulus value of the protection member PP is greater than about 8 GPa, elasticity is degraded, so that the protection member PP may easily break. In an embodiment where the Young's modulus value of the protection member PP is in the above-described range, shape stability against an external force may be secured and sufficient strength to protect the functional layers disposed on the lower side of the protection member may be exhibited. That is, the protection member PP is formed to have a Young's modulus value of about 0.1 GPa to about 8 GPa, and thus, may have both flexibility for preventing defects such as cracks and impact resistance for protecting the functional layers disposed on the lower side of the protection member PP against an external impact.

The protection member PP according to an embodiment may include a base layer BP (see FIG. 9A to FIG. 9D) in the form of a film and a protection layer PL (see FIG. 9A to FIG. 9D) disposed at at least one of an upper portion side or a lower portion side (or on at least one selected from an upper surface and a lower surface) of the base layer BP (see FIGS. 9A to 9D). The protection layer PL (see FIG. 9A to FIG. 9D) may serve to improve optical properties and mechanical properties of the protection member PP. The protection member PP according to an embodiment will be described in greater detail later. In this specification, the protection member PP may be referred to as a protection film.

A window WP may be disposed on a display module DM. The window WP may be disposed on the protection member PP. In an embodiment, as shown in FIG. 7, the protection member PP may be disposed between the window WP and the anti-reflection layer AR, but is not limited thereto, and the stacking position of the protection member PP may be changed. For example, in an embodiment, the protection member PP may be disposed in an upper portion of the window WP.

A window adhesive layer OAP may be disposed below the window WP. The window adhesive layer OAP may be disposed between the window WP and the protection member PP to couple the window WP and the protection member PP to each other. However, the embodiment of the invention is not limited thereto, and alternatively, the window adhesive layer OAP may be omitted. In such an embodiment, the window WP may be directly disposed on the protection member PP.

Figure 8:
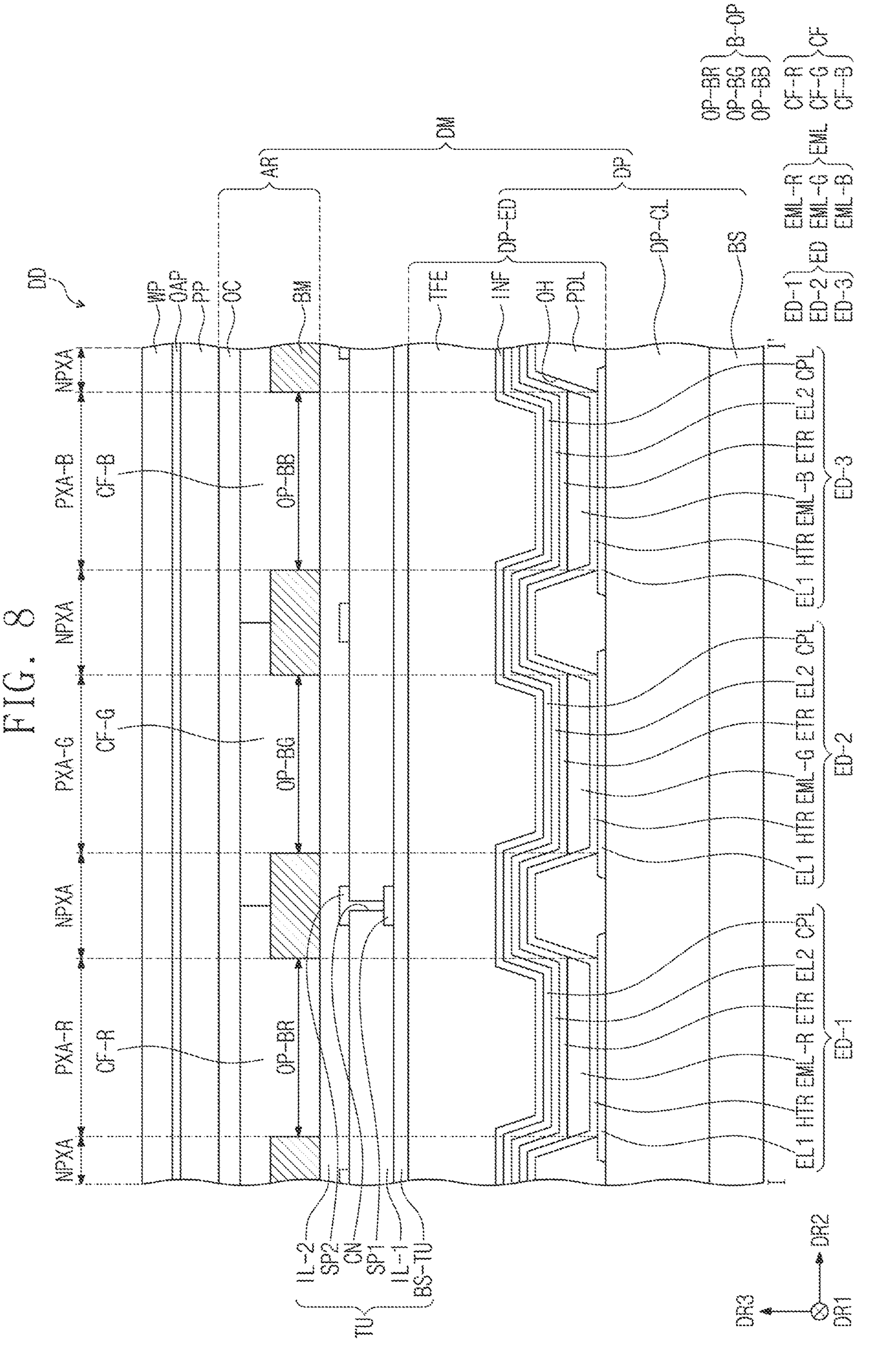
FIG. 8 is a cross-sectional view of a display device according to an alternative embodiment of the invention.

FIG. 8 is a cross-sectional view of a display device according to an alternative embodiment of the invention. The same or like elements shown in FIG. 8 are labeled with the same reference characters as used above to describe the embodiments shown in FIG. 7, and any repetitive detailed description thereof will hereinafter be omitted or simplified.

Referring to FIG. 8, the display device DD according to an embodiment include an anti-reflection layer AR, which is different from that shown in FIG. 7. In such an embodiment, the anti-reflection layer AR may include a color filter CF. The anti-reflection layer AR may include a light blocking portion BM and the color filter CF. The color filter CF includes a first color filter CF-R, a second color filter CF-G, and a third color filter CF-B.

The light blocking portion BM overlaps a peripheral region NPXA. The light blocking portion BM is a patter having a black color, and may include a light-blocking pattern. In an embodiment, the light blocking portion BM may include a black coloring agent. The black coloring agent may include a black dye, and or a black pigment. The black coloring agent may include carbon black, a metal such as chromium, or an oxide thereof.

In an embodiment, a light blocking opening B-OP corresponding to light emitting elements ED-1, ED-2, and ED-3 may be defined in the light blocking portion BM. In such an embodiment, first to third light blocking openings OP-BR, OP-BG, and OP-BB which respectively correspond to the first to third light emitting elements ED-1, ED-2, and ED-3 may be defined through the light blocking portion BM. The first light blocking opening OP-BR may overlap the first light emitting element ED-1. The second light blocking opening OP-BG may overlap the second light emitting element ED-2. The third light blocking opening OP-BB may overlap the third light emitting element ED-3.

The first color filter CF-R, the second color filter CF-G, and the third color filter CF-B may respectively correspond to a first light emitting region PXA-R, a second light emitting region PXA-G, and a third light emitting region PXA-B. The first color filter CF-R transmits first color light, i.e., red light, the second color filter CF-G transmits second color light, i.e., green light, and the third color filter CF-B transmits third color light, i.e., blue light. In an embodiment, for example, the first color filter CF-R may be a red color filter, the second color filter CF-G may be a green color filter, and the third color filter CF-B may be a blue color filter.

The first color filter CF-R, the second color filter CF-G, and the third color filter CF-B may lower the reflectance of external light. Each of the first to third color filters CF-R, CF-G, and CF-B transmits light of a specific wavelength region, and absorbs light of a wavelength region other than the corresponding wavelength region, and thus, may absorb most of external light incident from the outside and reflect only a portion thereof.

Each of the color filters CF-R, CF-G, and CF-B may include a base resin and a colorant dispersed in the base resin. The base resin is a medium in which a dye and/or a pigment is dispersed, and may include or be formed of various resin compositions which may be commonly referred to as a binder.

The first color filter CF-R may include a first first colorant. The first color filter CF-R may be a filter in which the first first colorant is dispersed in a base resin. The first first colorant may include a red pigment or dye. The second color filter CF-G may include a second first colorant. The second color filter CF-G may be a filter in which the second first colorant is dispersed in a base resin. The second first colorant may include a green pigment or dye. The third color filter CF-B may include a third first colorant. The third color filter CF-B may be a filter in which the third first colorant is dispersed in a base resin. The third first colorant may include a blue pigment or dye. However, the embodiment of the invention is not limited thereto, and the third color filter CF-B may not include a colorant. The third color filter CF-B may be transparent. The third color filter CF-B may include or be formed of a transparent photosensitive resin.

In addition, in an embodiment, the first color filter CF-R and the second color filter CF-G may each be a yellow filter. The first color filter CF-R and the second filter CF-G may be provided as one body (or integrally formed as a single unitary part) without being separated from each other.

The anti-reflection layer AR may include an overcoat layer OC disposed on the color filter CF. The overcoat layer OC may cover the first color filter CF-R, the second color filter CF-G, and the third color filter CF-B. The overcoat layer OC may include an organic substance, and may provide a flat surface. The overcoat layer OC may be overlap light emitting regions PXA-R, PXA-G, and PXA-B and the peripheral region NPXA. The overcoat layer OC may be optically transparent. In an embodiment, for example, the overcoat layer OC may have a transmittance of about 85% or greater for light in a wavelength region of about 380 nm to about 780 nm. In an embodiment, the overcoat layer OC may be omitted.

Each of a portion of the first color filter CF-R, a portion of the second color filter CF-G, and a portion of the third color filter CF-B, all of which are disposed in the peripheral region NPXA, may be disposed on the light blocking portion BM. In an embodiment, the light blocking portion BM is illustrated as being disposed lower than the first color filter CF-R, the second color filter CF-G, and the third color filter CF-B, but is not limited thereto. In an embodiment, the light blocking portion BM may be disposed on an upper side of at least one selected from the first color filter CF-R, the second color filter CF-G, and the third color filter CF-B, or the light blocking portion BM may be disposed at a same level as the level at which the first color filter CF-R, the second color filter CF-G, and the third color filter CF-B are disposed.

A protection member PP may be disposed on the anti-reflection layer AR. The protection member PP may be disposed on the overcoat layer OC of the anti-reflection layer AR.

A window WP may be disposed on a display module DM. The window WP may be disposed on the protection member PP. In an embodiment, as shown in FIG. 8, the protection member PP may be disposed between the window WP and the anti-reflection layer AR, but is not limited thereto, and the stacking position of the protection member PP may be changed. For example, in an embodiment, the protection member PP may be disposed in an upper portion of the window WP.

FIGS. 9A to 9D are cross-sectional views of a display device according to an embodiment of the invention. A display device DD of FIG. 9A to FIG. 9D is schematically illustrated to show the staking relationship of functional panels and/or functional units constituting a display device. For convenience of illustration and description, in FIG. 9A to FIG. 9D, components disposed below the anti-reflection layer AR among the components of the display device DD illustrated in FIG. 7 and FIG. 8 are not illustrated and omitted. Hereinafter, referring to FIG. 9A to FIG. 9D, a display device DD, DD-a, DD-b, or DD-c according to an embodiment will be described in detail. Hereinafter, any repetitive detailed description of the same elements in the display device DD, DD-a, DD-b or DD-c of FIG. 9A to FIG. 9D as those described above with reference to FIG. 1A to FIG. 8 will be omitted, and differences will be mainly described in detail.

Referring to FIG. 9A to FIG. 9D, in an embodiment, protection members PP, PP-a, PP-b, and PP-c may include a base layer BP, and a protection layer PL disposed in at least one selected from an upper portion and a lower portion of (or on at least one selected from an upper surface and a lower surface of) the base layer BP.

Figure 9A:
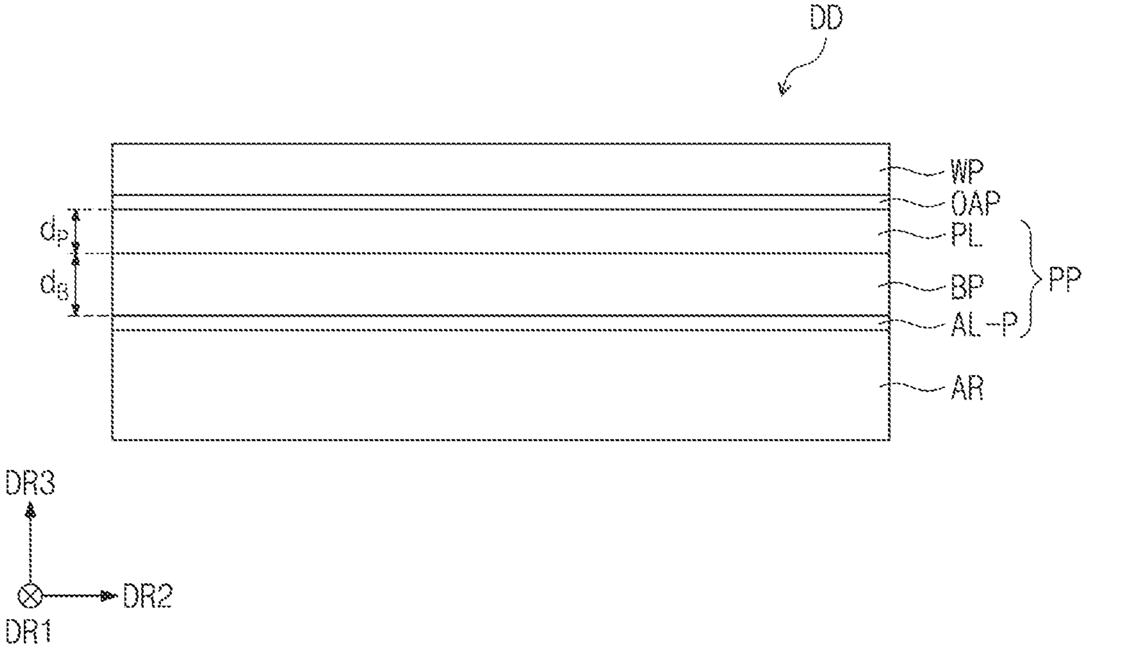
FIGS. 9A to 9D are cross-sectional views of a display device according to an embodiment of the invention.
Figure 9B:
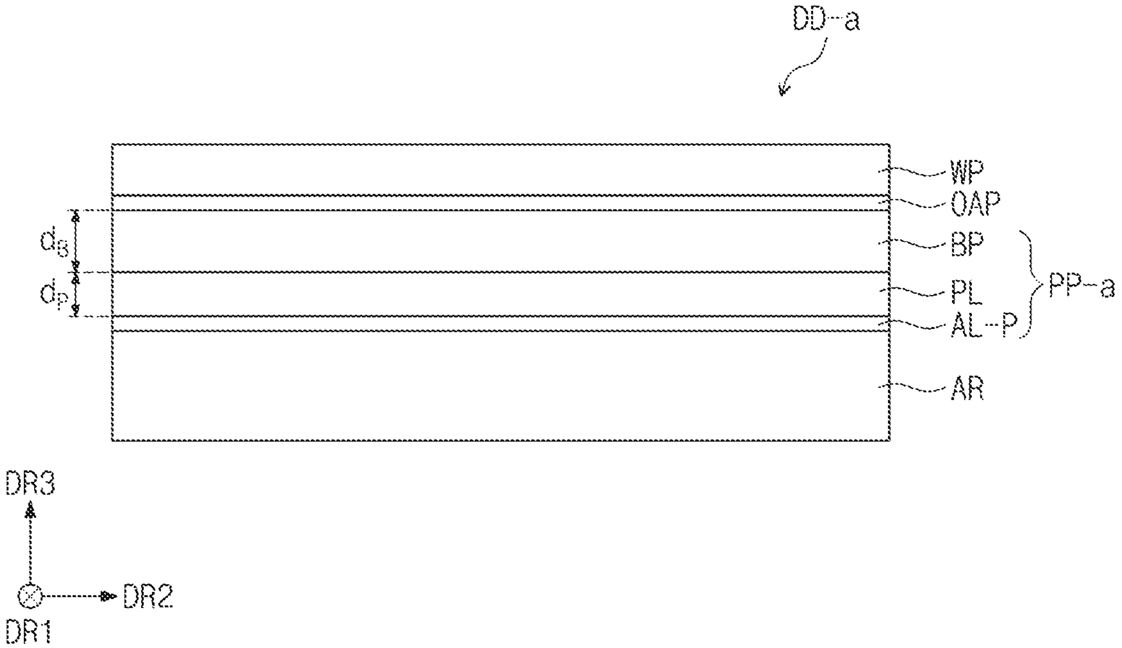
Figure 9C:
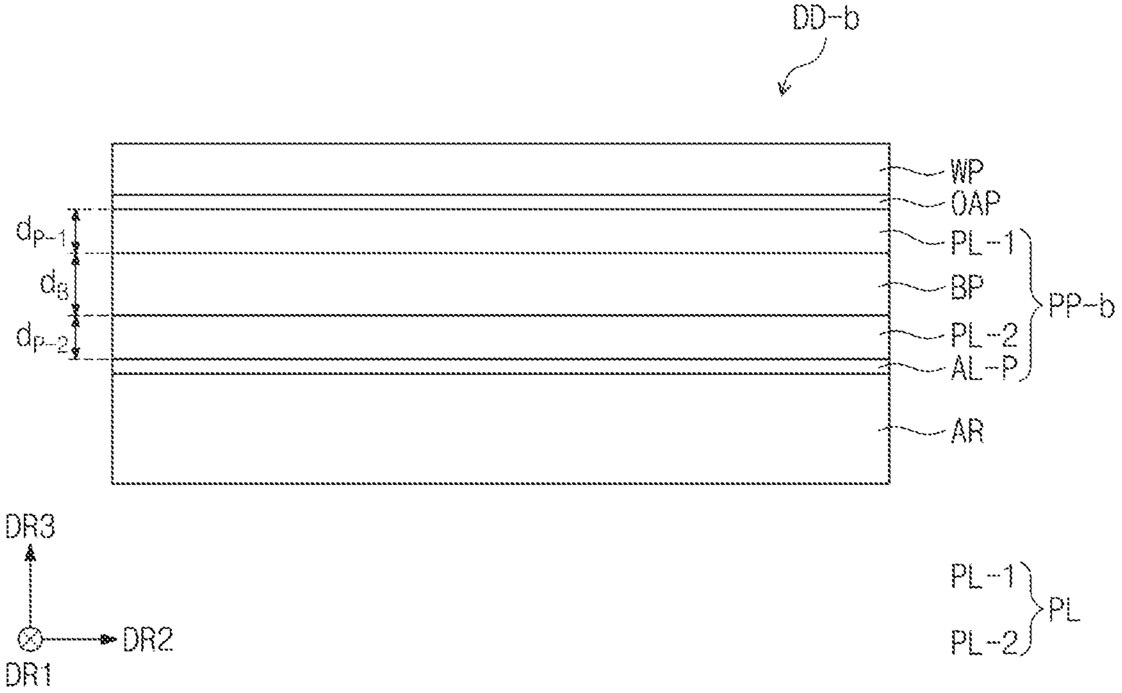
Figure 9D:
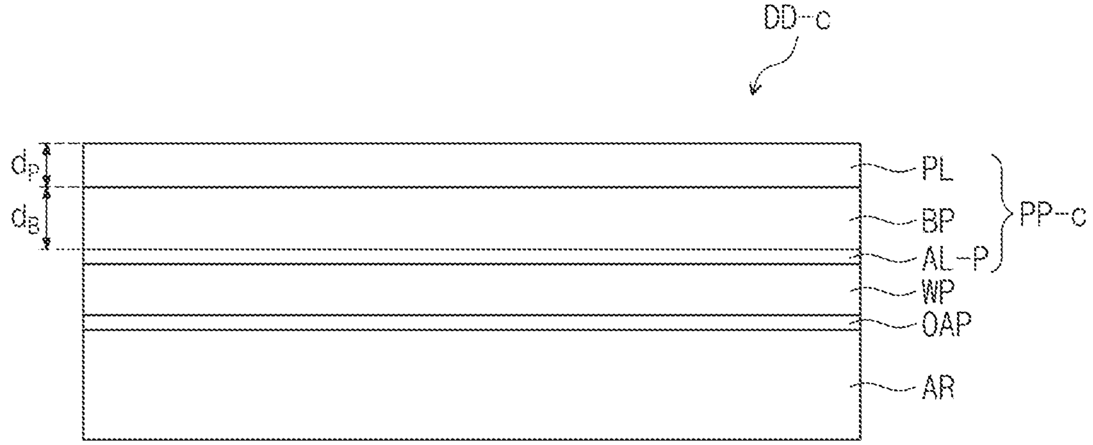

Referring to FIG. 9A, the display device DD according to an embodiment of the invention may include the protection member PP disposed on an anti-reflection layer AR. The protection member PP according to an embodiment may include the base layer BP and the protection layer PL. In addition, the protection member PP according to an embodiment may further include an adhesive layer AL-P. The base layer BP, the protection layer PL, and the adhesive layer AL-P included in the protection member PP according to an embodiment illustrated in FIG. 9A as well as the protection members PP-a, PP-b or PP-c according to an embodiment described with reference to FIG. 9B to FIG. 9D are substantially the same as those described above.

The base layer BP may serve to absorb an external impact, thereby reducing an impact transferred to functional layers disposed in a lower portion of the protection member PP, for example, a display panel DP, a sensor layer TU, the anti-reflection layer AR, and the like.

In the protection member PP according to an embodiment, the base layer BP may be a polymer film. The base layer BP may be made of, for example, polyimide (PI), polyethyleneterephthalate (PET), polyacrylate, polymethylmethacrylate (PMMA), polycarbonate (PC), polyethylenenaphthalate (PEN), polyvinylidene chloride, polyvinylidene difluoride (PVDF), polystyrene (PS), an ethylene-vinylalcohol copolymer, a cycloolefin polymer, triacetyl cellulose, or a combination thereof. However, the material of the base layer BP used in an embodiment is not limited to the polymer materials described above, and any material may be used without limitation as long as it has optical transparency capable of providing an image provided from the display module DM (see FIG. 1B) of the display device DD (see FIG. 1B) to a user. Specifically, the protection member PP according to an embodiment may include, as the base layer BP, a polyacrylate film, a polycarbonate film, a triacetyl cellulose film, or a transparent polyethylene terephthalate film.

The base layer BP may be a polymer film having high optical properties. Accordingly, in the protection member PP according to an embodiment, when the base layer BP includes a polyacrylate film, a polycarbonate film, a triacetyl cellulose film, or a transparent polyethylene terephthalate film described above, the protection member PP may exhibit desired optical properties such as low haze, a high transmittance in a visible light region, or the like.

A thickness de of the base layer BP may be in a range of about 20 μm to about 125 μm. If the thickness de of the base layer BP is less than about 20 μm, the base layer BP may not serve as a support layer provided with the protection layer PL and the like, or to serve to protect a lower display module DM (see FIG. 7 and FIG. 8) and the like. In addition, if thickness de of the base layer BP is greater than about 125 μm, the total thickness of the display device DD (see FIG. 1B) increases, so that it may be difficult to implement desired optical properties and mechanical properties.

In an embodiment, the protection member PP may include one base layer BP. The protection member PP according to an embodiment may include one polymer film. In an embodiment, the base layer BP may be a single polymer film layer. That is, the protection member PP according to an embodiment may not include an additional polymer film in addition to the base layer BP. However, the embodiment of the invention is not limited thereto, and the base layer BP may be provided in a form in which a plurality of polymer films are stacked.

The protection layer PL may exhibit high optical properties. The protection layer PL according to an embodiment may have a low light transmittance of about 10% or less (for light) in a wavelength range of about 380 nm to about 410 nm. In an embodiment, for example, the protection layer PL may have a low light transmittance of about 0% to about 10% in a wavelength range of about 380 nm to about 410 nm. The protection layer PL of may have a low light transmittance of about 1% or less in a wavelength range of about 380 nm to about 400 nm. In an embodiment, for example, the protection layer PL may have a low light transmittance of about 0% to about 1% in a wavelength range of about 380 nm to about 400 nm. In addition, the protection layer PL according to an embodiment may have a high transmittance of about 87% or greater in a visible light region of about 450 nm to about 1 μm. In an embodiment, for example, the protection layer PL may have a high transmittance of about 87% or greater in a visible light region of about 450 nm to about 780 nm.

In the protection member PP according to an embodiment, the protection layer PL may include a hard coating agent and an ultraviolet light blocking agent. In the specification, the protection layer PL may be referred to as a hard coating layer.

The protection layer PL may be formed from or include a hard coating layer resin including at least one selected from an organic-based composition, an inorganic-based composition, and an organic and inorganic composite composition as the hard coating agent. In an embodiment, for example, the hard coating agent forming the hard coating layer may include at least one selected from an epoxy-based compound, a urethane-based compound, an epoxy-urethane-based compound, an acryl-urethane-based compound, an epoxy-urethane-acrylic compound, an acrylate-based compound, a siloxane compound, and a silsesquioxane compound. In addition, the hard coating agent may further include inorganic particles. However, the embodiment of the invention is not limited thereto.

The protection layer PL may include an ultraviolet light absorber. In this specification, the ultraviolet light absorber may absorb light in a wavelength region of about 380 nm to about 410 nm. The ultraviolet light absorber may be a light absorbing dye which absorbs light in a wavelength region of about 380 nm to about 410 nm. In this specification, a wavelength range of light absorbed by the ultraviolet light absorber may include an ultraviolet light region. The wavelength range of light absorbed by the ultraviolet light absorber may include an ultraviolet light region and a near ultraviolet light region.

In an embodiment, the protection layer PL including the ultraviolet light absorber may block light in a wavelength range of about 380 nm to about 410 nm. When the protection layer PL includes the ultraviolet light absorber, the protection layer PL may absorb ultraviolet light and near ultraviolet light in a wavelength range of about 380 nm to about 410 nm.

The ultraviolet light absorber is not particularly limited as long as it is a material which absorbs light in a wavelength range of about 380 nm to about 410 nm, and may include, for example, a benzotriazole-based, benzophenone-based, salicylic acid-based, salicylate-based, cyanoacrylate-based, cinnamate-based, oxanilide-based, polystyrene-based, polyferrosenylsilane-based, methine-based, azomethine-based, triazine-based, para-aminobenzoic acid-based, cinnamon acid-based, or uricanic acid-based light absorbing dye, or a combination thereof. However, the embodiment of the invention is not limited thereto.

In an embodiment where the protection layer PL includes the ultraviolet light absorber, the ultraviolet light absorber may be included in an amount of about 20 wt % or less based on the total weight of 100 wt % of a resin for forming the protection layer PL. In an embodiment, for example, the ultraviolet light absorber may be included in an amount of about 1 wt % to about 20 wt % based on the total weight of the resin for forming the protection layer PL.

In a case where the protection layer PL includes the ultraviolet light absorber, if the ultraviolet light absorber is included in an amount of less than 1 wt %, the ultraviolet light blocking rate may not be sufficient in the protection layer PL including the ultraviolet light absorber. In this case, if the ultraviolet light absorber is included in an amount of greater than about 20 wt %, the modulus of the protection layer PL may be excessively increased, or the function of other components included in the protection layer PL may be degraded, so that the reliability of the display device DD, DD-a, DD-b, or DD-c may not be secured. In an embodiment where the content of the ultraviolet light absorber satisfies the above range, the protection member PP may exhibit sufficient ultraviolet light blocking properties while securing mechanical reliability of the protection member PP. In an embodiment, the optical properties of the protection member PP, that is, the light transmittance, may be adjusted based on the content of the ultraviolet light absorber of the protection member PP. Accordingly, a desired light transmittance of the protection member PP may be adjusted or obtained by adjusting the content of the ultraviolet light absorber included in the protection member PP.

In an embodiment, the protection member PP may further include the adhesive layer AL-P. The display device DD according to an embodiment may include the adhesive layer AL-P disposed below the base layer BP. The display device DD according to an embodiment includes the adhesive layer AL-P, and thus may exhibit an effect in which optical properties such as transmittance and reflectance are improved. In an embodiment, the adhesive layer AL-P may include at least one of an acrylic resin, a urethane-based resin, or a silicone-based resin. However, the embodiment of the invention is not limited thereto.

The adhesive layer AL-P may couple the protection member PP and the anti-reflection layer AR to each other. The adhesive layer AL-P may be disposed between the base layer BP and the anti-reflection layer AR. The adhesive layer AL-P may be disposed between the base layer BP and the anti-reflection layer AR to couple the protection member PP and the anti-reflection layer AR.

In the protection member PP according to an embodiment, the adhesive layer AL-P may have a thickness in a range of about 3 μm to about 150 μm. The adhesive layer AL-P having a thickness in a range of about 3 μm to about 150 μm may increase coupling force between the protection member PP and the anti-reflection layer AR.

Referring back to FIG. 9A, in an embodiment, the protection layer PL may be disposed on the base layer BP. The protection layer PL may be disposed in an upper portion of the base layer BP, and the protection layer PL may be disposed on one surface of the base layer BP that is closer to the display surface IS (see FIG. 1A) of the display device DD, which is exposed to the outside. The protection layer PL may be directly disposed on an upper surface of the base layer BP. The upper surface of the base layer BP and a lower surface of the protection layer PL may be in contact with each other.

In an embodiment, the protection layer PL may be formed by providing a resin composition including a hard coating agent and an ultraviolet light absorber on the base layer BP using a method such as coating or the like, and then curing the resin composition. In addition, in an embodiment, the protection layer PL may be formed by curing a resin composition including a hard coating agent and an ultraviolet light absorber through a curing process of photocuring or thermal curing. However, the embodiment of the invention is not limited thereto. The resin composition for forming the protection layer PL according to an embodiment may further include an initiator. The initiator may be a photoinitiator or a thermal initiator.

In an embodiment, a thickness $d_P$ of the protection layer PL may be in a range of about 1 μm and to about 15 μm. The thickness $d_P$ of the protection layer PL may be a value measured as a distance from the upper surface of the base layer BP to an upper surface of the protection layer PL. If the thickness of the protection layer PL is less than 1 μm, the protection layer PL may not secure sufficient strength.

In an embodiment, the sum of the thickness $d_P$ of the base layer BP and the thickness $d_P$ of the protection layer PL may be about 25 μm or greater. In an embodiment, for example, the sum of the thickness de of the base layer BP and the thickness $d_P$ of the protection layer PL may be in a range of about 25 μm to about 340 μm. If the sum of the thickness $d_P$ of the base layer BP and the thickness $d_P$ of the protection layer PL is less than about 25 μm, the protection member PP does not secure sufficient strength, and thus may have a degraded function of protecting functional layers disposed below the protection member PP, for example, the display panel DP, the sensor layer TU, the anti-reflection layer AR, and the like. In addition, if the sum of the thickness de of the base layer BP and the thickness $d_P$ of the protection layer PL is greater than 340 μm, the thickness of the display device DD excessively increases, so that light efficiency may be reduced.

In an embodiment, disposition positions of the base layer BP and the protection layer PL may be changed. The display device DD-a according to an embodiment, as illustrated in FIG. 9B, may include a protection member PP-a including a base layer BP and a protection layer PL disposed in a lower portion of the base layer BP. in an embodiment, as illustrated in FIG. 9B, the protection member PP-a may have a disposition position of the protection layer PL, which is different from that shown in FIG. 9A. The display device DD-a illustrated in FIG. 9B is substantially the same as the display device DD illustrated in FIG. 9A except that the protection layer PL is disposed in the lower portion of the base layer BP in the protection member PP. With respect to each functional layer included in the protection member PP-a according to an embodiment illustrated in FIG. 9B, the above-described descriptions of the functional layers included in the protection member PP of FIG. 9A may be equally applied.

In an embodiment, as illustrated in FIG. 9B, the protection member PP-a may include the base layer BP and the protection layer PL. In addition, the protection member PP-a may further include the adhesive layer AL-P disposed between the protection layer PL and the anti-reflection layer AR.

In the protection member PP-a according to an embodiment, the protection layer PL may be directly disposed in the lower portion of the base layer BP. The protection layer PL may be in contact with a lower surface of the base layer BP. The upper surface of the protection layer PL and the lower surface of the base layer BP may be in contact with each other.

The protection member PP-a according to an embodiment may include one base layer BP. The protection member PP-a according to an embodiment may include one polymer film. That is, the protection member PP-a according to an embodiment may not include an additional polymer film in addition to the base layer BP which is in contact with the protection layer PL.

In an embodiment where the protection layer PL is disposed in a lower portion of the base layer BP, the adhesive layer AL-P may be disposed below the protection layer PL. The adhesive layer AL-P may be disposed in a lower portion of the protection layer PL to couple the protection member PP and the anti-reflection layer AR. However, the embodiment of the invention is not limited thereto, and the adhesive layer AL-P may be omitted in the protection member PP. In this case, the protection layer PL may be directly disposed on the anti-reflection layer AR.

FIGS. 9C and 9D illustrate a disposition relationship of a protection member PP in a display device according to an embodiment, which is different from that illustrated in FIG. 9A. The same or like elements shown in FIG. 9C and FIG. 9D have been labeled with the same reference characters as used above to describe the embodiment shown in FIG. 9A, and any repetitive detailed description thereof will hereinafter be omitted or simplified.

In an embodiment, as illustrated in FIG. 9C to FIG. 9D, the display device DD-b or DD-c may include the protection member PP-b or PP-c disposed on an anti-reflection layer AR.

In an embodiment, as illustrated in FIG. 9C, the protection member PP-b may include a plurality of protection layers PL-1 and PL-2. In such an embodiment of the display device DD-b, the protection member PP-b may include a base layer BP, a first protection layer PL-1 disposed in an upper portion (or on an upper surface) of the base layer BP, and a second protection layer PL-2 disposed in a lower portion (or on a lower surface) of the base layer BP. The first protection layer PL-1 may be directly disposed on an upper surface of the base layer BP. A lower surface of the first protection layer PL-1 and the upper surface of the base layer BP may be in contact with each other. The second protection layer PL-2 may be directly disposed on a lower surface of the base layer BP. An upper surface of the second protection layer PL-2 and the lower surface of the base layer BP may be in contact with each other.

The protection member PP-b according to an embodiment may include a single base layer BP. The protection member PP-b according to an embodiment may include a single polymer film. That is, the protection member PP-b according to an embodiment may not include an additional polymer film other than the base layer BP in contact with the first protection layer PL-1 and the second protection layer PL-2.

In an embodiment, a thickness $d_{P\text{-}1}$ of the first protection layer PL-1 and a thickness $d_{P\text{-}2}$ of the second protection layer PL-2 may each be in a range of about 1 μm to about 15 μm. The thickness $d_{P\text{-}1}$ of the first protection layer PL-1 may be a value measured as a distance from the upper surface of the base layer BP to an upper surface of the first protection layer PL-1. The thickness $d_{P\text{-}2}$ of the second protection layer PL-2 may be a value measured as a distance from the lower surface of the base layer BP to a lower surface of the second protection layer PL-2.

In an embodiment, the sum of the thickness de of the base layer BP and a thickness of the protection layer PL-a may be about 25 μm or greater. That is, the sum of the thickness d of the base layer BP, the thickness $d_{P\text{-}1}$ of the first protection layer PL-1, and the thickness $d_{P\text{-}2}$ of the second protection layer PL-2 may be about 25 μm or greater. In an embodiment, for example, the sum of the thickness de of the base layer BP, the thickness $d_{P\text{-}1}$ of the first protection layer PL-1, and the thickness $d_{P\text{-}2}$ of the second protection layer PL-2 may be in a range of about 25 μm to about 340 μm. If the sum of the thickness de of the base layer BP, the thickness $d_{P\text{-}1}$ of the first protection layer PL-1, and the thickness $d_{P\text{-}2}$ of the second protection layer PL-2 is less than about 25 μm, the protection member PP-b does not secure sufficient strength, and thus may have a degraded function of protecting functional layers disposed below the protection member PP-b, for example, a display panel DP, a sensor layer TU, an anti-reflection layer AR, and the like. In addition, if the sum of the thickness de of the base layer BP, the thickness $d_{P\text{-}1}$ of the first protection layer PL-1, and the thickness $d_{P\text{-}2}$ of the second protection layer PL-2 is greater than about 340 μm, the thickness of the display device DD excessively increases, so that light efficiency may be reduced.

In an embodiment, each of the first protection layer PL-1 and the second protection layer PL-2 may include a hard coating agent and an ultraviolet light absorber. In an embodiment, each of the first protection layer PL-1 and the second protection layer PL-2 including an ultraviolet light absorber may block light in a wavelength range of about 380 nm to about 410 nm. In an embodiment where each of the first protection layer PL-1 and the second protection layer PL-2 includes an ultraviolet light absorber, each of the first protection layer PL-1 and the second protection layer PL-2 may absorb ultraviolet light of the same wavelength range. However, the embodiment of the invention is not limited thereto, and each of the first protection layer PL-1 and the second protection layer PL-2 may overlap only in some wavelength ranges and absorb ultraviolet light. In an embodiment, for example, wavelength ranges of light blocked by each of the first protection layer PL-1 and the second protection layer PL-2 may be different from each other, and a wavelength range of light finally blocked by the first protection layer PL-1 and the second protection layer PL-2 which include an ultraviolet light absorber may be about 380 nm to about 410 nm. In an embodiment, the light transmittance in a blocked wavelength range may be about 10% or less.

The protection member PP-b may further include an adhesive layer AL-P disposed below the base layer BP. In the protection member PP-b according to an embodiment, the adhesive layer AL-P may be disposed below the second protection layer PL-2. The adhesive layer AL-P may be directly disposed in a lower portion of the second protection layer PL-2. An upper surface of the adhesive layer AL-P may be in contact with a lower surface of the second protection layer PL-2. However, the embodiment of the invention is not limited thereto, and the adhesive layer AL-P may be omitted, and the second protection layer PL-2 may be directly disposed on the anti-reflection layer AR.

In an embodiment, as illustrated in FIG. 9D, the protection member PP-c may be disposed on a window WP in the display device DD-c. In the display device DD-c according to an embodiment, the protection member PP-c may include an adhesive layer AL-P, a base layer BP, and a protection layer PL which are sequentially stacked in the third direction DR3. In such an embodiment of the display device DD-c, a lower surface of the protection layer PL may be in contact with the base layer BP, and an upper surface of the protection layer PL may be the uppermost surface exposed to the outside.

The window WP may be disposed on the anti-reflection layer AR. The window WP may be disposed between protection member PP-c and the anti-reflection layer AR. A window adhesive layer OAP may be disposed below the window WP. The window adhesive layer OAP may be disposed between the window WP and the anti-reflection layer AR to couple the window WP and the anti-reflection layer AR. However, the embodiment of the invention is not limited thereto, and the window adhesive layer OAP may be omitted. In an embodiment, the window WP may be directly disposed on the anti-reflection layer AR.

The adhesive layer AL-P may be disposed below the base layer BP. The adhesive layer AL-P may be disposed in a lower portion of the base layer BP. The adhesive layer AL-P may be disposed between the base layer BP and the window WP. The adhesive layer AL-P may be disposed in the lower portion of the base layer BP to couple the protection member PP-c and the window WP.

The display device DD, DD-a, DD-b, or DD-c according to an embodiment may be provided with the protection member PP, PP-a, PP-b, or PP-c disposed on the anti-reflection layer AR, where protection member PP, PP-a, PP-b, or PP-c includes the base layer BP, and the protection layer PL including a hard coating agent or an ultraviolet light absorber at at least one of an upper portion side or a lower portion side of the base layer BP, and thus may efficiently block ultraviolet light provided to the display panel DP (see FIG. 7 and FIG. 8), and may protect the display panel DP (see FIG. 7 and FIG. 8) and the like from an external impact.

Figure 10:
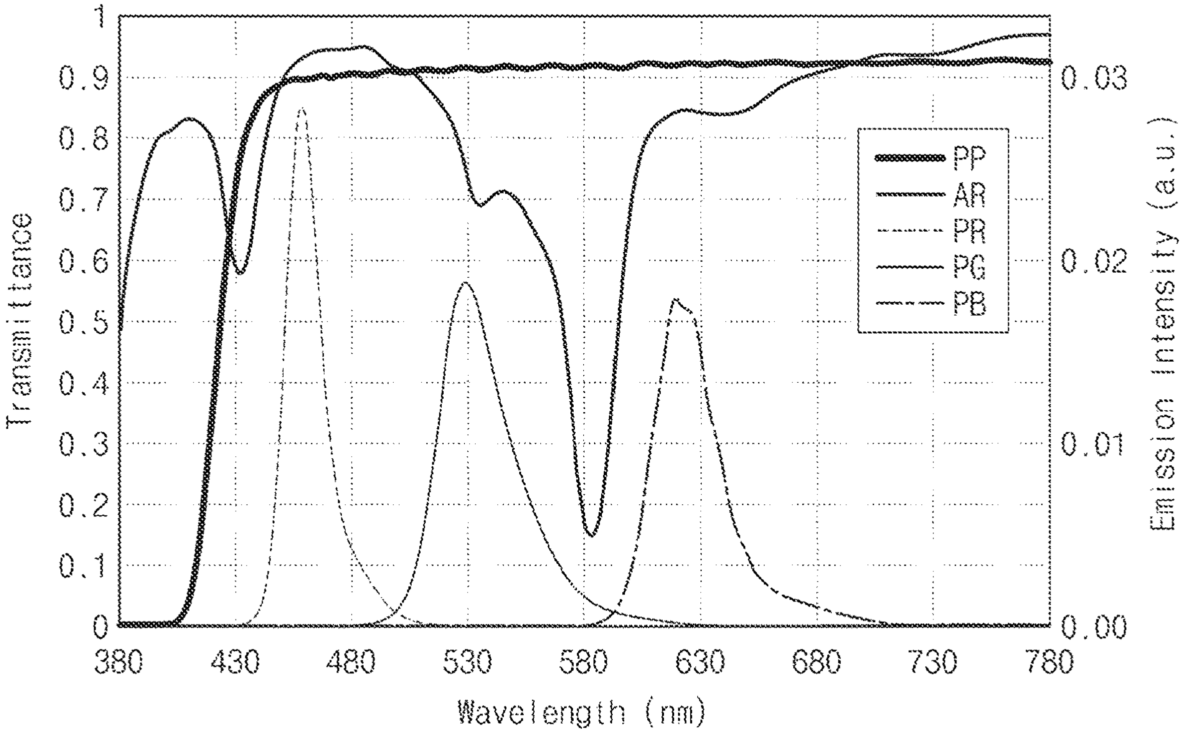
FIG. 10 is a view showing the transmittance of a protection member and the wavelength of an anti-reflection layer versus the wavelength of light according to an embodiment of the invention and the light emission spectrum for each light emitting region of a display device according to an embodiment of the invention.

FIG. 10 is a view showing the transmittance of a protection member and an anti-reflection layer versus the wavelength of light according to an embodiment of the invention and the light emission spectrum for each light emitting region of a display device according to an embodiment of the invention. In FIG. 10, the transmittance versus a wavelength was measured at the protection member PP shown in FIG. 9A and the anti-reflection layer AR shown in FIG. 7.

In FIG. 10, PR is an emission intensity spectrum of light emitted from the first light emitting element ED-1 (see FIG. 7 and FIG. 8), PG is an emission intensity spectrum of light emitted from the second light emitting element ED-2 (see FIG. 7 and FIG. 8), and PB is an emission intensity spectrum of light emitted from the third light emitting element. The PR has a first peak wavelength of about 625 nm to about 675 nm, the PG has a second peak wavelength of about 500 nm to about 570 nm, and the PB has a third peak wavelength of about 430 nm to about 480 nm.

An anti-reflection layer according to an embodiment has a first peak in a wavelength range of about 575 nm to about 600 nm, and a second peak in a wavelength range of about 420 nm to about 440 nm. The anti-reflection layer according to an embodiment may absorb light in a wavelength range of about 575 nm to about 600 nm and light in a wavelength range of about 420 nm to about 440 nm, and may transmit light in the remaining wavelength ranges. Accordingly, it is possible to improve color reproducibility of the display device DD by preventing reflection by external light and adjusting the color of light emitted from a light emitting region of the display panel DP.

In addition, as shown by the light transmittance graph for a protection member according to an embodiment, it can be confirmed that the protection member according to an embodiment exhibits a light transmittance of about 10% or less in a wavelength range of about 380 nm to about 410 nm. In addition, it can be confirmed that the protection member according to an embodiment has a light transmittance of about 0% in a wavelength range of about 380 nm to about 400 nm, and a light transmittance of about 87% or greater in a wavelength range of about 440 nm to about 780 nm. Accordingly, since the protection member according to an embodiment effectively blocks ultraviolet light while having a high transmittance with respect to visible light, light emitted from a light emitting module passes through the protection member with high efficiency, so that it can be seen that and a clear image may be visually recognized without color distortion.

When a display device is exposed to ultraviolet light, a light emitting element included in the display device may be easily deteriorated by the ultraviolet light, and accordingly, a problem may occur in which the light efficiency of the light emitting element is degraded. The display device according to an embodiment may efficiently block ultraviolet light, among light incident on a display panel, by a protection member, so that the deterioration of light emitting elements caused by ultraviolet light may be effectively prevented.

In addition, the protection member according to an embodiment of the invention blocks light in an ultraviolet light region while having a high transmittance with respect to blue light of about 430 nm to about 480 nm, so that the emission efficiency of a blue color may not be impaired. The protection member according to an embodiment may have a light transmittance of about 10% or less in a wavelength range of about 380 nm to about 410 nm, which is an ultraviolet light region, and may have a light transmittance of about 85% or greater in a wavelength range of about 430 nm to about 480 nm. Accordingly, efficiency of blue light may not be impaired while efficiently blocking light in the ultraviolet light region among light incident on a display device.

Hereinafter, referring to Example and Comparative Example, a display device including a protection member according to an embodiment of the invention will be described in detail. Example shown below is for illustrative purposes only to facilitate the understanding of the invention, and thus, the scope of the invention is not limited thereto.

EXAMPLE

1. Manufacturing and Evaluation of Display Device

Manufacturing of Example

A display device including the stacking structure illustrated in FIG. 7 was manufactured. A protection member included in Example includes an adhesive layer, a base layer, and a protection layer sequentially stacked in a thickness direction as illustrated in FIG. 9A, where the protection layer includes a hard coating agent and an ultraviolet light absorber.

Manufacturing of Comparative Example

A display device was manufactured in the same manner as in Example, except that the protection member does not include a protection layer, and the base layer includes an ultraviolet light absorber. That is, Comparative Example corresponds to a display device using a polymer film provided with an ultraviolet light absorber and an adhesive layer attached under the polymer film as a protection member.

Evaluation of Properties of Display Device

Table 1 below shows the evaluation results of the display devices of the above-described Example and Comparative Example. Table 1 shows the correlated color temperature (CCT), minimum perceptible color difference (MPCD), and light efficiency values of Example and Comparative Example. The measurement values shown in Table 1 are for the display devices of the above-described Example and Comparative Example. In Table 1, the polymer films of the base layers used in Example and Comparative Example correspond to the same kind. Example corresponds to a display device using a protection member according to an embodiment provided with a base layer, which is a polymer film, and a protection layer including a hard coating agent and an ultraviolet light absorber on one surface of the base layer.

TABLE 1

| Item | Example | Comparative Example |
|---|---|---|
| ΔMPCD | 5.2 | 7.5 |
| ΔTc (K) | 97 | 179 |
| Red | 95.0% | 93.2% |
| Green | 99.8% | 100.0% |
| Blue | 97.6% | 97.2% |
| White | 98.4% | 98.0% |

Referring to the results of Table 1, it can be confirmed that Example has a correlated color temperature change value about 97 K, which is significantly lower than the correlated color temperature change value of Comparative Example. In addition, it can be confirmed that the MPCD change value of Example is about 5.2, which is also lower than the MPCD change value of Comparative Example. In addition, it can be confirmed that the emission efficiency of Example is similar or improved compared with that of Comparative Example. Compared with that of Comparative Example, the green efficiency of Example exhibits similar values, and it can be seen that the red, blue, and white efficiencies of Example are all improved. Accordingly, compared with Comparative Example, in Example, it can be confirmed that light in an ultraviolet light region is effectively blocked by a protection member, so that ultraviolet light reaching a light emitting element is relatively small, thereby reducing the deterioration of the light emitting element.

Particularly, it can be seen that the red efficiency of Comparative Example exhibits a value of about 93.2%, which is lower than those of the green, blue, and white efficiencies. This means that the display device of Comparative Example did not efficiently block the light in the ultraviolet light region, so that the light emitting element was deteriorated. On the contrary, it can be seen that the red efficiency of Example was increased by 1.8% compared with Comparative Example. Accordingly, it can be seen that the display device of Example exhibits high optical properties and improved emission efficiency properties compared with Comparative Example in which ultraviolet light was applied to the base layer of the protection member.

As a result, when comparing the evaluation results of Example and Comparative Example, it can be confirmed that Example exhibits improved optical properties compared with Comparative Example. That is, compared with Comparative Example including the protection member which includes the ultraviolet light absorber in the base layer, it can be confirmed that the display device of Example exhibits high optical properties.

In the case of the display device of Example, by blocking ultraviolet light entering from the outside from reaching a light emitting element and causing deterioration of a compound included in the light emitting element, damage that may occur when the light emitting element is continuously exposed to ultraviolet light may be effectively prevented. Accordingly, the display device of Example may exhibit improved reliability and durability.

Figure 11A:
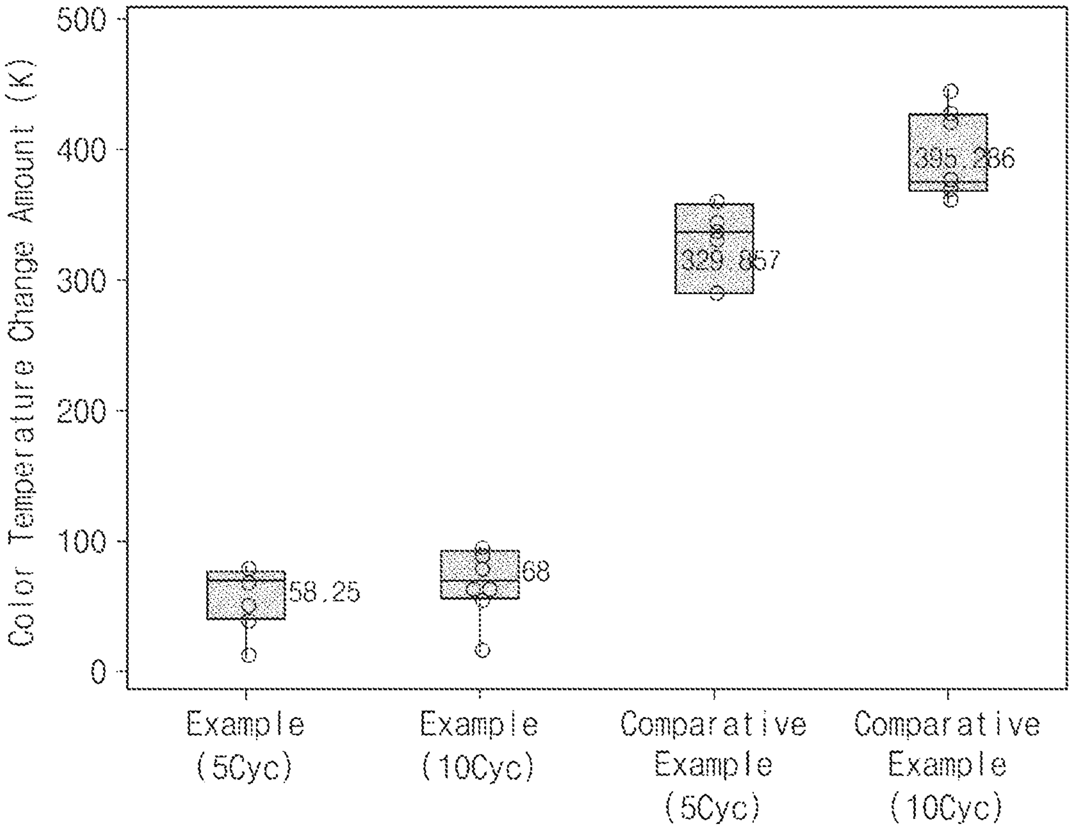
FIG. 11A and FIG. 11B show the result of evaluating light resistance properties of a display device according to an embodiment of the invention.
Figure 11B:
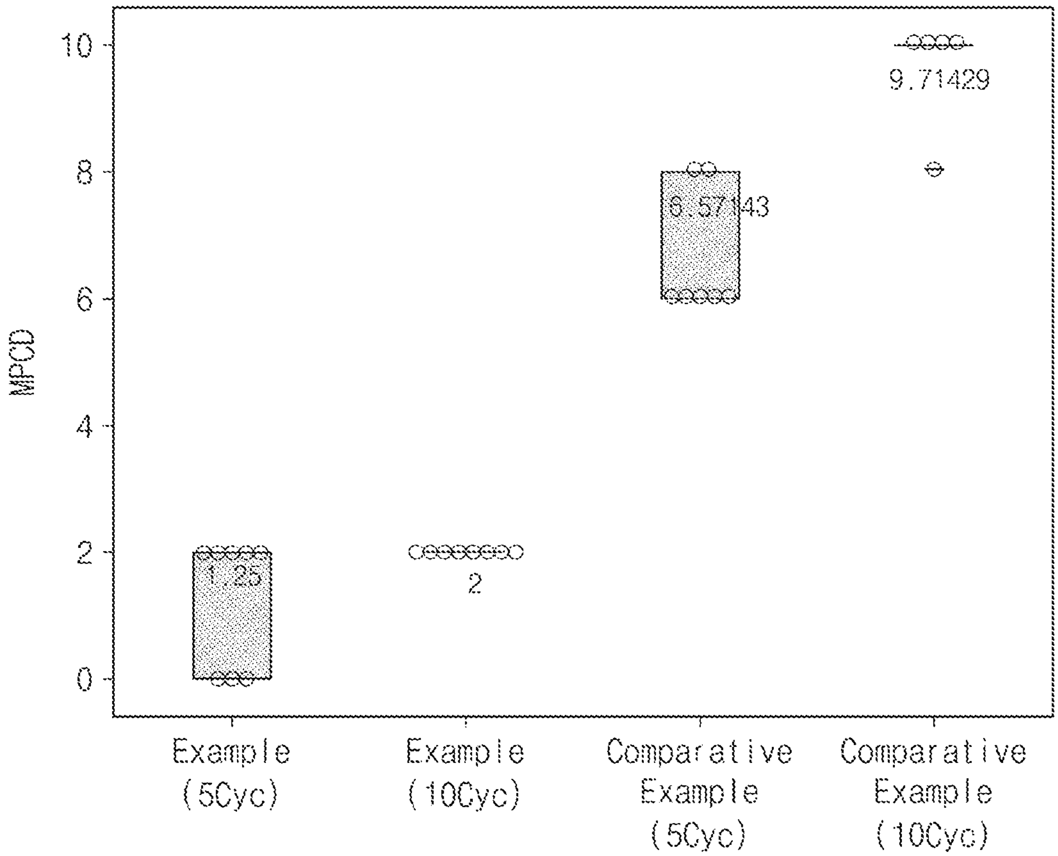

FIG. 11A and FIG. 11B show the result of evaluating light resistance properties of a display device according to an embodiment of the invention. FIG. 11A is a graph showing the amount of change in correlated color temperature of the display devices according to Example and Comparative Example. FIG. 11B is a graph showing the amount of change in minimum perceptible color difference of the display devices according to Example and Comparative Example. FIG. 11A shows the comparison between correlated color temperatures after 5 times of light exposure tests and correlated color temperatures after 10 times of light exposure tests in the display devices of Example and Comparative Example. FIG. 11B shows the comparison between MPCDs 5 times of light exposure tests and MPCDs after 10 times of light exposure tests in the display devices of Example and Comparative Example. Here, the times and 10 times of light exposure tests were measured using the display color analyzer CA-310, and respectively correspond to performing a cycle a total of 5 times and a total of 10 times, wherein one cycle was set by irradiating UV light for 8 hours under a temperature condition of 40° C., then removing the UV light and leaving the same to stand at 25° C. for 4 hours.

The color temperature is a numerical representation of the color of a light source using the absolute temperature. The closer the light source is to red, the lower the color temperature, and the closer the light source is to blue, the higher the color temperature. The MPCD is a numerical representation of the minimum perceptible difference in colors.

As shown in FIG. 11A, although Example and Comparative Example showed a change in color temperature of 400K or less, which is a specification range, Example exhibited a low change in color temperature compared to that of Comparative Example, and it can be confirmed that there was a big difference from 400 K, which may be detected with the naked eye. In the case of Example, it can be confirmed that the average of changes in color temperature in 5 times and 10 times of light exposure tests is 58.25 K and 68 K, respectively. On the contrary, in the case of Comparative Example, it can be confirmed that the average of changes in color temperature in 5 times and 10 times of light exposure tests is 330 K and 395 K, respectively, which are higher changes in color temperature than those of Example.

As illustrated in FIG. 11B, although Example and Comparative Example showed a change in color temperature of 10 or less, which is a specification range, Example exhibited a low change in MPCD compared to that of Comparative Example, and it can be confirmed that there was a big difference from the specification range. In the case of Example, it can be confirmed that the average of changes in MPCD in 5 times and 10 times of light exposure tests is 1.25 and 2, respectively, which are lower changes in MPCD than those of Comparative Example.

It can be seen that the display device according to an embodiment efficiently blocks light in a wavelength range of about 380 nm to about 410 nm by including an ultraviolet light absorber in a protection layer disposed on one surface of a base layer, thereby exhibiting good results in the light exposure test. Compared with Comparative Example which includes an ultraviolet light absorber in a base layer, the display device according to an embodiment may efficiently block ultraviolet light by including the ultraviolet light absorber in the protection layer disposed on one surface of the base layer, thereby exhibiting high optical properties.

Table 2 below shows ball drop test results for the protection member of Example. In the ball drop test, a metal ball having a weight of 0.5 g was dropped on the protection member at different heights, and the minimum height (cm) at which cracking began to occur was evaluated. The higher the number, the better the impact resistance. If the ball drop test experiment value is 3 cm or greater, it may be determined to be good, and if smaller than that, it may be determined to be poor. The drop height refers to a distance between the metal ball and the protection member.

TABLE 2

| Item | Example |
|---|---|
| Minimum height (cm) | 4 cm |

Referring to Table 2 above, it can be confirmed that in the case of Example, the minimum height during the ball drop test was 4 cm, thereby indicating good performance in the ball drop test. That is, it can be seen that the protection member of Example exhibits high impact resistance.

Table 3 below shows Dupont impact test results for the display device of Example. In the Dupont impact test, a weight having a weight of 30 g was dropped on the front of the display device of Example to measure the minimum height (cm) at which cracking occurred. The higher the number, the better the impact resistance, and in this specification, if the experiment value in the Dupont impact test is 9 cm or greater, it may be determined to be good, and if smaller than that, it may be determined to be poor. The height measured in the Dupont impact test refers to a distance between the weight and the display device.

TABLE 3

| Item | Example |
|---|---|
| Minimum height (cm) | 12 cm |

Referring to Table 3 above, it can be confirmed that Example has good impact resistance since the minimum height of the Dupont test result value for Example is 12 cm.

Table 4 below shows dynamic impact test results for the display devices according to Example and Comparative Example. In the dynamic impact test, impact resistance was measured by applying an impact to a side portion of each of the display devices according to Example and Comparative Example. The display devices of Example and Comparative Example were fixed on a stage inclined at 70° with respect to a horizontal plane, and then a metal circular tip having a diameter of 10 mm was vertically suspended and fixed such that an impact could be applied to the display device. Thereafter, an angle formed by a vertical plane and the metal circular tip was increased from 3° by 0.5°, and the fixing of the metal circular tip was released to apply an impact to a side surface of the display device and an angle at which cracking began to occur was evaluated. The higher the number, the better the impact resistance. If the dynamic impact test experiment value is 5° or greater, it may be determined to be good, and if smaller than that, it may be determined to be poor.

TABLE 4

| Item | Example | Comparative Example |
|---|---|---|
| Minimum value | 5.5° | 5.5° |

Referring to Table 4 above, it can be confirmed that the display device according to Example has the same level of impact resistance as that of the display device according to Comparative Example. The display device of Example may maintain the same level of impact resistance as that of the display device of Comparative Example to prevent damage due to an external impact. Accordingly, the display device of Example may exhibit higher durability. The protection member PP according to an embodiment is provided with the base layer BP and the protection layer PL disposed on an upper surface or a lower surface of the base layer BP, where the protection layer PL includes a hard coating agent and an ultraviolet light absorber, so that the ultraviolet light blocking rate of the protection member PP may be maintained at a low level of about 10% or less and at the same time, sufficient mechanical reliability may be secured, thereby implementing a display device having both improved light resistance reliability and impact resistance.

The display device DD according to an embodiment allows the protection layer PL to include a hard coating agent and an ultraviolet light absorber, so that ultraviolet light finally provided to the display panel DP may be effectively blocked and mechanical properties of the protection member PP may be effectively prevented from degrading.

A protection film according to an embodiment includes a hard coating layer and an ultraviolet light absorber in a protection layer disposed on an upper surface or a lower surface of a base layer, so that it is possible to effectively block ultraviolet light while maintaining high mechanical properties.

A display device according to an embodiment has a protection layer disposed on an upper surface or a lower surface of a base layer, and includes a hard coating layer and an ultraviolet light absorber in the protection layer, thereby effectively blocking ultraviolet light while maintaining high mechanical properties to exhibit improved display quality.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel;
a sensor layer disposed on the display panel;
an anti-reflection layer disposed on the sensor layer, wherein the anti-reflection layer includes a colorant; and
a protection member disposed on the anti-reflection layer,
wherein the display panel includes:
a base substrate;
a light emitting element disposed on the base substrate; and
an encapsulation layer disposed on the light emitting element,
wherein the protection member includes:
a base layer; and
a protection layer disposed on at least one selected from an upper surface and a lower surface of the base layer, wherein the protection layer includes a hard coating agent and an ultraviolet light absorber.

2. The display device of claim 1, wherein a light transmittance of the protection member is about 10% or less for light in a wavelength range of about 380 nm to about 410 nm, and about 87% or greater for light in a wavelength range of about 450 nm to about 1000 nm.

3. The display device of claim 1, wherein a light transmittance of the protection member is about 1% or less for light in a wavelength range of about 380 nm to about 400 nm.

4. The display device of claim 1, wherein a thickness of the protection layer is less than a thickness of the base layer.

5. The display device of claim 1, wherein:
a thickness of the protection layer is in a range of about 1 μm to about 15 μm; and
a thickness of the base layer is in a range of about 20 μm to about 125 μm.

6. The display device of claim 1, wherein the protection layer is disposed on the upper surface of the base layer, and is in contact with the upper surface of the base layer.

7. The display device of claim 1, wherein the protection layer is disposed on the lower surface of the base layer.

8. The display device of claim 1, wherein the protection layer includes:
a first protection layer disposed on the upper surface of the base layer; and
a second protection layer disposed on the lower surface of the base layer.

9. The display device of claim 1, wherein the protection member further comprises an adhesive layer disposed between the base layer and the anti-reflection layer.

10. The display device of claim 1, further comprising:
a window disposed on the anti-reflection layer,
wherein the protection member is disposed between the anti-reflection layer and the window or disposed on an upper surface of the window.

11. The display device of claim 1, wherein the colorant included in the anti-reflection layer has a maximum absorption wavelength in a wavelength region of about 490 nm to about 505 nm and about 585 nm to about 600 nm.

12. The display device of claim 1,
wherein a first light emitting region, from which a first light is emitted, and a second light emitting region, from which a second light having a different light emitting wavelength from the first light is emitted, are defined on the base substrate, wherein the anti-reflection layer includes:

a first color filter overlapping the first light emitting region, and including a first first colorant;

a second color filter overlapping the second light emitting region, and including a second first colorant having a different maximum absorption wavelength from the first first colorant; and an overcoating layer covering the first color filter and the second color filter, and overlapping the first light emitting region and the second light emitting region.

13. The display device of claim 1, wherein a light emitting region and a light blocking region adjacent to the light emitting region are defined on the base substrate, wherein the anti-reflection layer further includes a light blocking portion overlapping the light blocking region.

14. The display device of claim 13, wherein the sensor layer comprises:

a sensor base layer disposed on the encapsulation layer;

a first conductive layer disposed on the sensor base layer;

an inorganic insulation layer disposed on the first conductive layer;

a second conductive layer disposed on the inorganic insulation layer; and an organic insulation layer disposed on the second conductive layer, wherein the first conductive layer and the second conductive layer overlap the light blocking portion on a plane.

15. The display device of claim 1, wherein the display panel further comprises an inorganic deposition layer disposed on the light emitting element, wherein the inorganic deposition layer includes an inorganic material having a refractive index of about 1.0 or greater and a light absorption coefficient of about 0.5 or greater.

16. The display device of claim 1, wherein the light emitting element comprises:

a first electrode disposed on the base layer;

a hole transport region disposed on the first electrode;

a light emitting layer disposed on the hole transport region;

an electron transport region disposed on the light emitting layer;

a second electrode disposed on the electron transport region; and a capping layer disposed on the second electrode.

17. The display device of claim 1, wherein the display panel comprises:

a first region overlapping the light emitting element;

a second region spaced apart from the first region, and not overlapping the light emitting element; and a bending region disposed between the first region and the second region, and having a predetermined radius of curvature, wherein the protection member overlaps the first region, and does not overlap the bending region.

18. The display device of claim 17, further comprising:

a bending protection layer disposed on the display panel, and overlapping the bending region, wherein a side surface of the protection member is in contact with the bending protection layer.

19. A display device comprising:

a display panel;

a sensor layer disposed on the display panel;

an anti-reflection layer disposed on the sensor layer, wherein the anti-reflection layer includes a colorant; and a protection member disposed on the anti-reflection layer, wherein the display panel includes:

a base substrate;

a light emitting element disposed on the base substrate; and an encapsulation layer disposed on the light emitting element, wherein the protection member includes:

a base layer; and a hard coating layer disposed on at least one selected from an upper surface and a lower surface of the base layer, wherein the hard coating layer has a light transmittance of about 10% or less for light in a wavelength region of about 380 nm to about 410 nm, and has a light transmittance of about 85% or greater for light in a wavelength region of about 430 nm to about 480 nm.

20. The display device of claim 19, wherein:

a thickness of the hard coating layer is in a range of about 1 μm to about 15 μm; and a thickness of the base layer is in a range of about 20 μm to about 60 μm, wherein a sum of the thickness of the hard coating layer and the thickness of the base layer is about 25 μm or greater.

* * * * *